United States Patent [19]

Dieterich

[11] Patent Number: 4,575,770
[45] Date of Patent: Mar. 11, 1986

[54] VIDEO DISC DATA SYSTEMS FOR INTERACTIVE APPLICATIONS

[75] Inventor: Charles B. Dieterich, Middlesex County, N.J.

[73] Assignee: RCA Corporation, Princeton, N.J.

[21] Appl. No.: 558,368

[22] Filed: Dec. 5, 1983

[51] Int. Cl.[4] .................................................. G11B 7/00
[52] U.S. Cl. ..................... 358/342; 358/147; 369/43; 369/44; 369/47; 369/50; 369/59
[58] Field of Search ................... 358/342, 147; 369/43, 369/44, 47, 50, 59; 371/37, 38, 39

[56] References Cited

U.S. PATENT DOCUMENTS

| | | | |
|---|---|---|---|
| 4,307,418 | 12/1981 | Mindel et al. | 358/128.5 |
| 4,308,557 | 12/1981 | Dieterich | 358/128.5 |
| 4,309,721 | 1/1982 | Christopher | 358/128.5 |
| 4,313,134 | 1/1982 | Rustman et al. | 358/728.5 |
| 4,488,278 | 12/1984 | Dieterich | 369/50 |

Primary Examiner—Robert L. Richardson
Attorney, Agent, or Firm—P. J. Rasmussen; P. M. Emanuel; R. G. Coalter

[57] ABSTRACT

In a video disc mastering system, player control data is conveyed by a block code having framing and field number bits and data for use by a computer external to the player is conveyed by a convolutional code having no framing bits, having error check bits related to a subset of the field number bits conveyed by the player control data and having vertical parity selected to spread data required for predictive and reconstructive error correction over a number of video fields greater than that recorded on one convolution of the disc information track. Data is downloaded to an external computer for interactive player applications by means of a decoder which utilizes the player framing and field number codes conveyed by the player control data to recover the convolutionally encoded data as well as detecting tracking errors to provide a high data transfer rate, orders of magnitude of improvement in word error rates and facilitating new refinements in intrafield track error correction, namely, correction of intrafield track skips occuring after the player control data.

19 Claims, 17 Drawing Figures

| PARITY | FORMULA |
|---|---|
| $P_N$ | $A_{N+1} \oplus A_{N+2} \oplus A_{N+7}$ |
| $P'_N$ | $A_{N+1}' \oplus A_{N+2}' \oplus A_{N+7}'$ |
| $P''_N$ | $A_{N+1}'' \oplus A_{N+2}'' \oplus A_{N+7}''$ |
| $P'''_N$ | $A_{N+1}''' \oplus A_{N+2}''' \oplus A_{N+7}'''$ |

N = FRAME NUMBER

*Fig. 3*

| UNKNOWN | KNOWN |
|---|---|
| $A_{N+1}$ | $P_N \oplus A_{N+2} \oplus A_{N+7}$ |
| $A_{N+2}$ | $A_{N+1} \oplus P_N \oplus A_{N+7}$ |
| $A_{N+3}$ | $A_{N+1} \oplus A_{N+2} \oplus P_N$ |

*Fig. 4*

DISC SPIRAL (EXPANDED RADIAL SCALE)

$P_N = A_{N+1} \oplus A_{N+2} \oplus A_{N+7}$

VIDEO DISC DATA SYSTEMS FOR INTERACTIVE APPLICATIONS

FIELD OF THE INVENTION

This invention relates to television systems generally and particularly to video disc systems of the type wherein digital auxiliary information is recorded with video information and recovered upon playback of a disc for providing certain player control functions and wherein further data is recorded for use by a device external to the player to facilitate "interactive" uses of the player. Such a device may be, for example, a computer or computerized video game wherein the video disc player is used as a program data source as well as a video source.

BACKGROUND OF THE INVENTION

U.S. Pat. No. 4,308,557 of C. B. Dieterich entitled "VIDEO DISC SYSTEM" which issued Dec. 29, 1981, describes video disc recording and playback apparatus wherein video fields on a disc are identified by digital information recorded during a selected line of the vertical interval during each field of the recorded video signal. This digital "auxiliary" information, commonly known as the system "DAXI" code, is used to control a number of video disc player operating functions during playback of the disc, such as calculation and display of elapsed playing time, lifting the pick-up stylus at the end of the program material, detection and correction of locked grooves, etc.

As proposed by Dieterich, the recorded DAXI code includes, in the order named, a Barker start code sequence, an error detection check code and a plurality of information bits which include a field number corresponding to each recorded video field. The DAXI code format desirably provides improvements in noise immunity and simplifies the decoding hardware requirements for the player.

Further improvements for decoding the DAXI data of the Dieterich format are described by Christopher in U.S. Pat. No. 4,309,721 entitled "ERROR CODING FOR VIDEO DISC SYSTEM" which issued Jan. 5, 1981. In Christopher's system the error code portion of the DAXI data is chosen so that the error code check register in the video disc player begins with the system start code in the register and, if no errors are detected after the full data message is received, also ends with the start code in the check register. This desirably simplifies the DAXI decoding logic in the video disc player.

Other U.S. Patents relating to use of DAXI code in a video disc player are No. 4,307,418 entitled "VIDEO DISC PLAYER SYSTEM FOR CORRELATING STYLUS POSITION WITH INFORMATION PREVIOUSLY DETECTED FROM DISC" which issued Jan. 26, 1982, and No. 4,313,134 entitled "TRACK ERROR CORRECTION SYSTEM AS FOR VIDEO DISC PLAYER" which issued Jan. 26, 1982, to Rustman et al.

Video disc records employing the DAXI encoding format are commericially available, for example, from RCA Corporation and CBS, Incorporated. In such records, chrominance information is recorded in the "buried subcarrier" (BSC) format proposed by D. Pritchard in U.S. Pat. No. 3,872,498. The DAXI code is recorded by pulse code modulation (PCM) of the luminance signal level during line 17 of odd fields and line 280 of even fields. The DAXI data comprises a 77 bit PCM word. The start of each bit period is synchronized with the "buried" color subcarrier frequency (about 1.53 MHz for NTSC compatible players) to facilitate subsequent detection in the player. Each DAXI word comprises a 13 bit start code (a Barker sequence for data framing) followed by a 13 bit CRC (cyclic redundancy check) error check code and ending with a 51 bit information code. Of the 51 bits in the information code, 6 provide a record band number, 18 provide a video field identification number and the remaining 27 are currently not assigned but are included to provide information capacity for future expansion or other uses of the DAXI code.

In certain video disc players for use with DAXI encoded discs, the PCM signal is obtained from the subtractive output tap of a 1-H delay comb filter in the video signal path. Each line of DAXI code is preceeded by a blank video line. As a result of the subtraction of the current and previous video lines, the resultant PCM signal is "self-referenced" and is therefore relatively unaffected by D. C. drift. This simplifies subsequent PCM detection and reduces potential bit errors which might otherwise occur without such drift compensation. Examples of video disc players wherein DAXI information is comb filtered prior to PCM detection are given in U.S. Pat. No. 4,275,416 of Dieterich entitled "PCM DETECTOR" and U.S. Pat. No. 4,278,992 of Christopher entitled "PCM DETECTOR FOR VIDEO REPRODUCER APPARATUS".

In systems of the type described, it would be desirable to provide a source of digital information for use by a device external to the player (e.g., a computer, a game accessory, etc.) to facilitate interactive uses of the video disc system. Since there are currently a total of 27 "unassigned" information bits in the DAXI code, it would appear that these bits might be used to convey "interactive" program control information to the external device. Such an approach has the virtue of simplicity (no additional PCM detectors or error check decoders are needed) but suffers from numerous technical and performance disadvantages as will now be explained.

A first problem is that the DAXI code occurs on only one line per field. This corresponds to a data transfer or "through-put" rate of only 1620 bits per second (60 fields/second times 27 "spare" bits/field). A relatively short interactive program of, say, 4000 eight-bit bytes would thus require nearly twenty seconds to read (down load) assuming no redundancy and no error correction. Taking these factors into consideration, it might take a minute or more to transfer even such a simple program to the external computer or other device.

As a second example, one cannot avoid the data transfer rate problem by simply increasing the number of DAXI code lines in a given field. This is because conventional video disc players are designed to recognize repeated field numbers as a locked groove condition and to exit the locked groove condition by effecting radial translation of the player pickup stylus (known as stylus "kicking" or "skipping"). Accordingly, to preserve compatibility with existing records and players it is required that no video field contain more than one DAXI code line.

One approach to obtaining additional data without creating problems with the player DAXI control system is described in the U.S. patent application of N. O. Ny entitled "VIDEO DISC SYSTEM HAVING TRUE AND COMPLEMENTED DIGITAL AUXILIARY INFORMATION CODES" Ser. No. 489,304 which was filed Apr. 28, 1983. In the Ny system additional data is recorded in the DAXI format but the data bits are inverted. Each data line is recorded on the video disc as a triad of lines comprising a blank line, the "inverted DAXI" line and a line of "masking data" in the order named. This format, for reasons described in detail in the Ny application is compatible with all video disc players using DAXI control systems e.g., the capacitance electronic disc (CED) players manufactured for example, by RCA Corporation, and provides up to 27 bits of additional information per triad of data lines. The Ny system desirably provides this added data capability with minimal added circuitry in the player but the overall data rate is not high and errors, while detectable with a conventional DAXI information buffer integrated circuit, are not correctable in the DAXI code format.

SUMMARY OF THE INVENTION

The present invention resides in part in the recognition that coding systems of the DAXI or similar types which are optimized for purposes of video disc player control functions are not optimal for the more demanding purposes of providing large amounts of data at high speeds and with high integrity to an external device such as a computer or computer based game. In fact, the transfer of data from a video disc to an external device, commonly known as "data down loading", places substantially different requirements on the data coding systems.

As one example, it has been found that in a known DAXI encoded video disc system that the word error rate (WER) is on the order of one percent (0.01). This means that, on average, one of each one hundred DAXI code words is unusable. This WER is perfectly adequate for player machine control functions (such as calculating elapsed playing time, etc.)and users of such video disc players are completely unaware that a bit or word error has occurred. A WER of 0.01 is, however, unacceptably high where downloaded data comprises, for example, a computer program. In such applications there is a need for several orders of magnitude of improvement.

It is, therefore, an object of the invention to provide a video disc coding system having the capacity for a WER improvement of about six additional orders of magnitude or better.

Another problem to be solved concerns burst errors wherein several lines of data may be lost as a group. This problem is unique to disc based systems wherein a disc defect may span several video fields and wherein a tracking error can result in several video frames of lost data. The term "video field of data" or "field of data" denotes the agregate of all data recorded in a video field. The term "video frame of data" is defined similarly, where a video frame comprises two video fields. In one commercially available video disc system, for example, there are eight fields per convolution of the information track so that an erroneous skip of one track convolution results in an eight field skip in the recovered data. This type of error cannot occur in video tape based systems since a one track error results in the loss of only one data field.

It is, therefore, a further object of the invention to provide a coding and decoding arrangement tolerant of gross data losses and in which all the lost data, within certain limits, may be completely recovered.

In meeting the foregoing objects of the invention it is necessary to employ a certain amount of data redundancy. The redundancy burden or "code overhead" tends to undesirably reduce the data transfer rate.

It is, therefore, a further object of the invention to provide video disc encoding and decoding systems wherein a substantial reduction in the overall code "overhead" or burden is achieved without sacrificing either the data transfer rate or the data word error rate.

In accordance with a first aspect of the invention, apparatus for encoding data on a video signal to be recorded on a disc includes a first means for modulating a line of the video signal with block encoded data inclusive of a framing code and a field number code. A second means modulates the video signal during a subsequent line thereof with convolutionally encoded data having an error check code conveying information relating to a subset of said field number code. The convolutionally encoded data is timed with respect to the block encoded data, includes no framing code and spans a number of video fields greater than the number of fields contained on one convolution of the disc information track.

A player for use with discs encoded as described includes a detector responsive to the framing code for generating clocking signals for decoding the convolutional code. A subset of field numbers recovered from the block code is used to initialize the convolutional code error check decoder which provides a check of the position of the player signal recovery transducer to facilitate track error correction.

BRIEF DESCRIPTION OF THE DRAWING

FIG. 3 is a table listing of parity equations for FIG. 2;

FIG. 4 is a table listing of equations by which convolutionally encoded data may be reconstructed or predicted;

DETAILED DESCRIPTION

Overview

Figure 1:
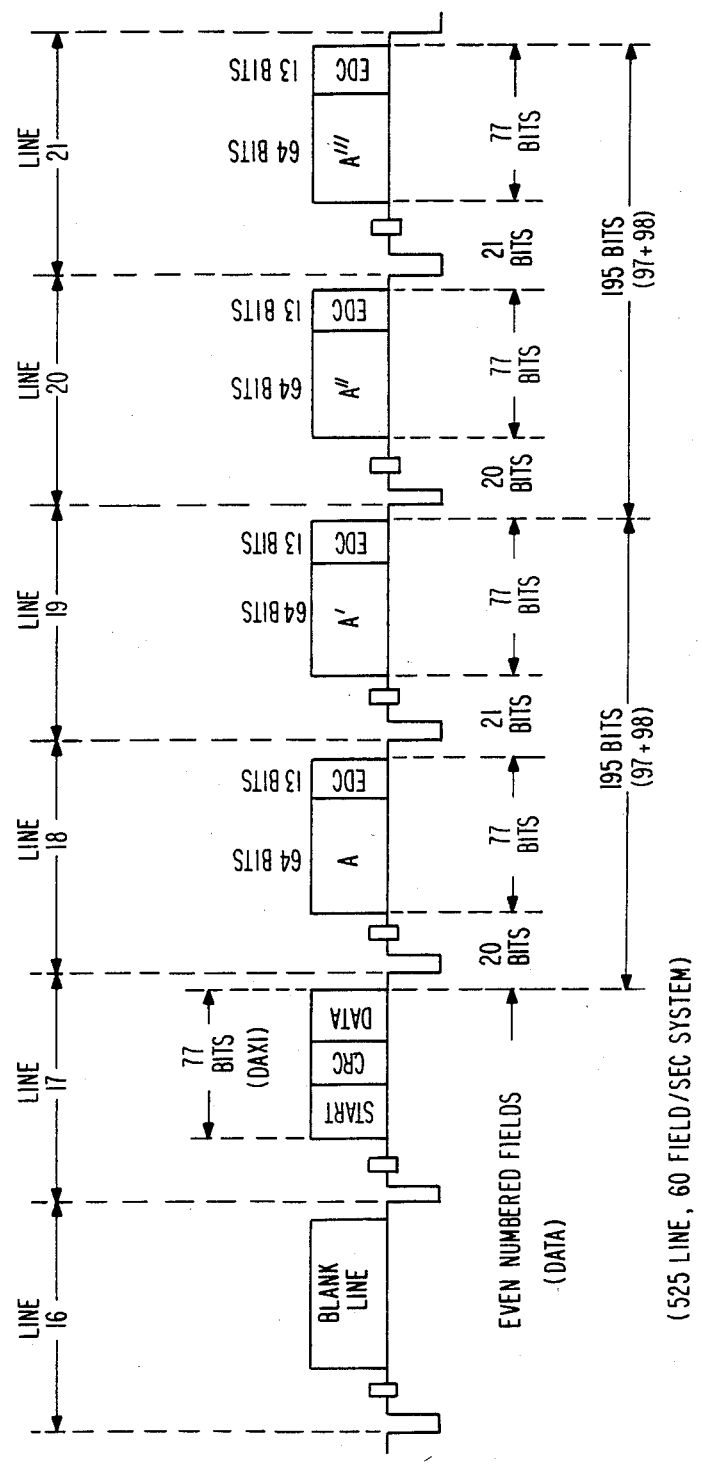
FIGS. 1 and 2 are timing diagrams of an encoding format embodying the invention for even numbered fields (FIG. 1) and odd numbered fields (FIG. 2)

The previously described DAXI encoding and decoding arrangements exemplify a particular form of data encoding (known as block coding) which is ideally suited to a special type of digital data, namely, machine (player) control data. This type of data is, so to speak, in a class by itself because its required integrity is to a great extent determined by human factors associated with the normal use of the player (e.g., viewing video programs). If, for example, one line of the DAXI code is in error, the error is detected, and the player control microprocessor simply waits for the next "good" line of DAXI data. The waiting time is short with respect to viewer reaction times (e.g., one or perhaps a few video fields) and thus the viewer will generally be unaware that any machine control data was missed. A failure, for example, of the player to update the disc playing time (minutes) during each field is not the kind of data error which would be noticeable to a viewer. Since high data rates are not necessary in player control operations, the known DAXI code has provisions only for detecting data errors but no provisions for correcting them. Errors, in the DAXI code, are simply "flagged" to prevent the player microprocessor from operating on the "bad" data.

In certain interactive applications of a video disc player a different form of data encoding is needed, namely, one capable of correcting as well as detecting errors. In the following examples of the invention, data for use by an external device (e.g., a computer or computer based game) is encoded in a convolutional format having certain special features directly related to the DAXI code and to the physical structure of the video disc itself. Three of these features are: (1) the convolutional code has no framing bits; (2) the convolutional code error check bits include information related to a subset of the field numbers conveyed by the DAXI (block) code; and (3) the convolutional code parity equation is selected to "spread" data required for predictive and reconstructive error correction over a number of fields greater than the number of fields recorded on one revolution of the disc.

The first feature increases the data transfer rate substantially. The second make possible new refinements in tracking error detection and the third feature adapts the code to a most likely tracking error, a one "groove" skip. Note, the term "groove" as used herein means convolution of the disc information track. The invention applies to grooved records (the well known CED system used in the United States of America) as well as to grooveless systems such as the VHD system used in Japan and laser (optical) type systems.

Code Structure

The structure of the convolutional code, its relation to the DAXI code and its relation to the physical structure of a video disc are illustrated in FIGS. 1–5. As used herein, the term DAXI (digital auxiliary information) code includes video disc player machine control codes having at least framing bits and field numbering bits and need not be the specific code referred to, for example, in the previously mentioned "DAXI" patents. For purposes of illustration and explanation, however, reference will be made to the standard DAXI code used for player control functions on video disc records manufactured, for example, by RCA Corporation and by CBS Incorporated. Also, for purposes of illustration, the code or data for use by the external device will be referred to as the "program" data or code. It may contain, for example, a program for a computer or game or it may represent specific conditional branch instructions or some other form of desired information (e.g., the locations of objects in the displayed TV picture).

Figure 2:
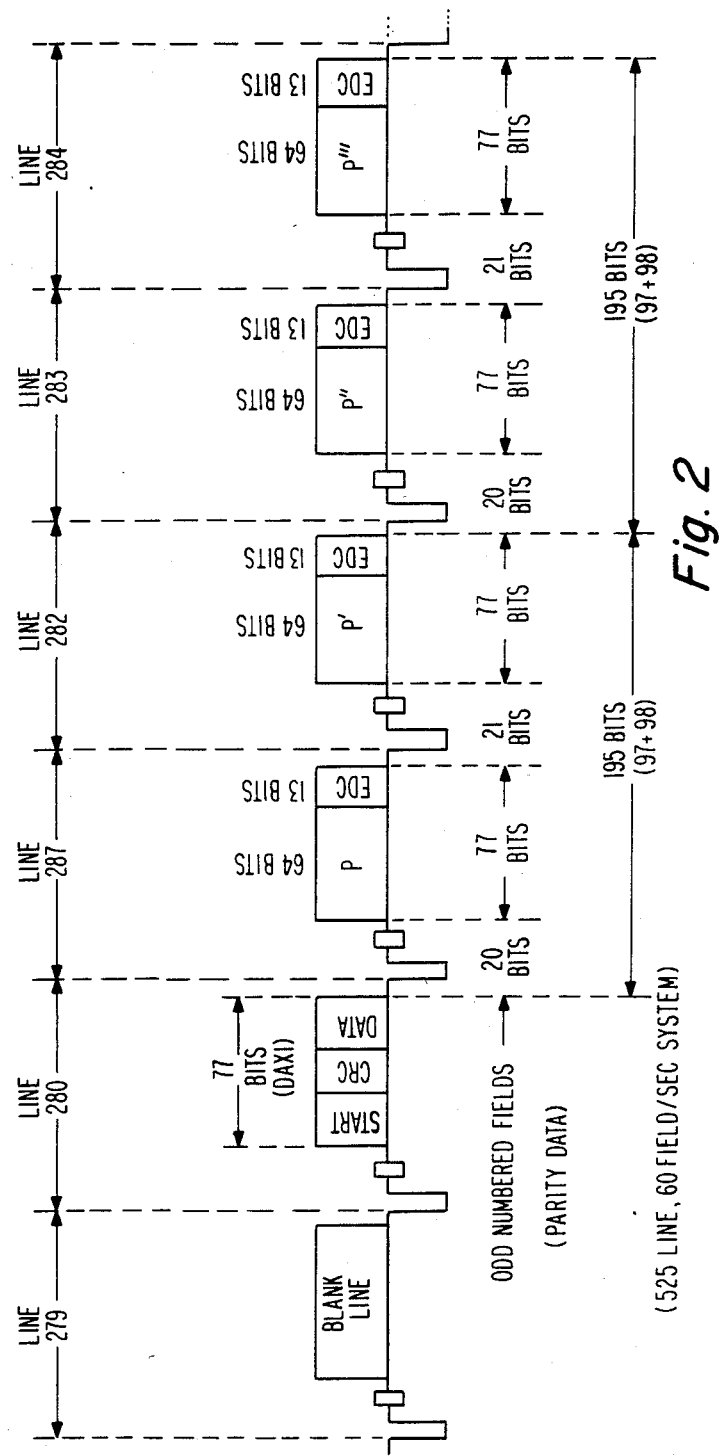

FIGS. 1 and 2 illustrate the timing relationship of the program code and the DAXI code for even and odd numbered fields, respectively. "Field numbers", as used herein, refer to the eighteen bit number in the DAXI code of each field recorded on the disc. This number is contained in the data portion of the 77 bit DAXI code on line 17 of even numbered fields and line 280 of odd numbered fields. Every line of the block encoded DAXI code is preceeded by a line of constant luminance signal level (lines 16 and 279) since the DAXI data is recovered in CED players from the subtractive output of the player comb filter as previously mentioned. Recovery of the program data, as explained subsequently, is done before comb filtering. This desirably eliminates the need for more lines of constant luminance signal level (as to the program data) thereby providing one of the means, in the present invention, of increasing the program data packing density and the down loading rate.

The "program code" is a convolutional code comprising program data blocks (the "A" blocks of FIG. 1) which alternate on a field-by-field basis with program parity blocks (the "P" blocks of FIG. 2). Each program data or parity block comprises 77 bits (as in the DAXI code) with 64 bits (eight bytes of eight bits each) for the program or parity data and 13 bits for an error detection code (EDC). No block of program code contains any data framing bits. Rather, all program data blocks (e.g., A, A', A'' and A''' on lines 18–21 of the even numbered fields) during one field and all corresponding program parity blocks during another field (e.g., P, P', P'' and P''' on lines 281–284 of odd numbered fields) are timed with respect to the DAXI code which includes a Barker bit sequence ("START") which identifies the data starting point with high accuracy. For bit timing purposes, no reliance is placed on any conventional video sync signals (e.g., vertical or horizontal sync) thereby eliminating problems with missing or distorted sync signals.

The absence of any framing bits in the program code is a second one of the means by which the data down loading rate is enhanced, in addition to that previously mentioned (i.e., the absence of blank lines preceeding the program code). Timing or "clocking" of each bit, as in the DAXI code, is in synchronism with the buried color subcarrier (BSC) reference frequency which, illustratively, is about 1.53 MHz in the NTSC standard (1.52 MHz for PAL type CED players). Buried subcarrier color (chrominance) signal encoding desirably improves the color signal-to-noise ratio in video disc applications (see, for example, U.S. Pat. No. 3,872,498 of Pritchard) and the BSC color burst provides an accurate and convenient bit clock reference frequency for subsequent data recovery (see for example, U.S. Pat. Nos. 4,308,557 and 4,275,416 of Dieterich).

Considering now certain timing details of FIGS. 1 and 2, there are four program code blocks of 77 bits each following the DAXI code. This format may be referred to as "DAXI PLUS FOUR" or simply "DAXI PLUS" encoding and provides a total of 32 eight-bit bytes of program data per video frame. The first program data block (A) begins 20 bits after the data of the DAXI data block and the second begins 21 bits after the EDC of the first. The reason for the different delay times to start of code (20 and 21 bits) is that there are 195 color subcarrier cycle intervals in two video lines. The alternate delays between lines of 20 and 21 bits assures that the total number of clock cycles for each program data line pair is exactly 195 bits (20+77+21+77) so that any number of additional program data blocks (e.g., A" and A''') may be added to the vertical interval (or to the "active" portion of a video field) without displacement of the data to a point where it might be interfered with by burst or sync. The same applies to the program parity blocks of FIG. 2.

The error detection code EDC of each data and parity block is based on a CRC (cyclic redundancy check) type of code, but is quite different from the standard DAXI CRC code. The EDC code is specifically designed (as will be explained in detail subsequently) to convey a subset of the 18 bit field number of the DAXI code so as to quickly identify a common form of video disc tracking error, namely, a "groove" or track skip of the player signal pick-up transducer. The EDC code, of course, identifies bit errors in the data (A) and parity (P) blocks but provides no error correction information. The purpose of the EDC code is mainly to identify or "flag" what will be herein referred to as "erasures" of P or A information. "Erasure" simply means that at least one of the 77 bits is in error. The "erasure flag" produced by the EDC code upon decoding identifies unusable data blocks. The convolutional code provides error correction. There are three choices for data recovery with convolutional (vertical parity) encoding. The choices are: (1) direct recovery (no error); (2) predictive recovery; and (3) reconstructive recovery.

FIG. 3 is a table defining the convolutional code parity check equations by which the P (vertical parity) bits of FIG. 2 are generated. Note that every block of parity data relates to a triad of subsequent lines of program data of the corresponding block. The P data, for example, is derived only from the A data, P' is derived from A' data, and so forth. The subscripts (N) in the table correspond to video frame numbers.

As an example of use of the equations, assume that P0 is to be calculated (this is the 64 bits of parity data for frame number zero). The first bit of the "word" P0 is obtained by exclusive-ORing (forming the exclusive logical sum) the first bit of the A data taken from the first, second and seventh subsequent video frames. This process is repeated on a bit-by-bit basis until all 64 bits of P0 are calculated. Parity blocks Po', Po" and P0''' are similarly formed from the corresponding subsequent data blocks A1', A2', A7'; A1", A2", A7"; and A1''', A2''', A7''', respectively. The program code may be extended or reduced as desired (i.e., there may be more or fewer than four lines of program code per field).

The table of FIG. 4 illustrates how "erased" program data words (EDC flag SET) may be reconstructed (or predicted). As an example, if the EDC "erasure" flag is set indicating that the A data of frame 1 is in error, the A1 data may be recovered by exclusive-ORing Po, A2 and A7. This corresponds to a "reconstruction" of lost data. As an example of the predictive nature of the convolutional code, assume that the EDC flag is not set when A1, A2 and Po are received. A7 may then be calculated even before it is received by exclusive-ORing A1, A2 and Po. The third option one has for recovering the A data is to simply read it directly if the EDC indicates that no errors are present.

Figure 5:
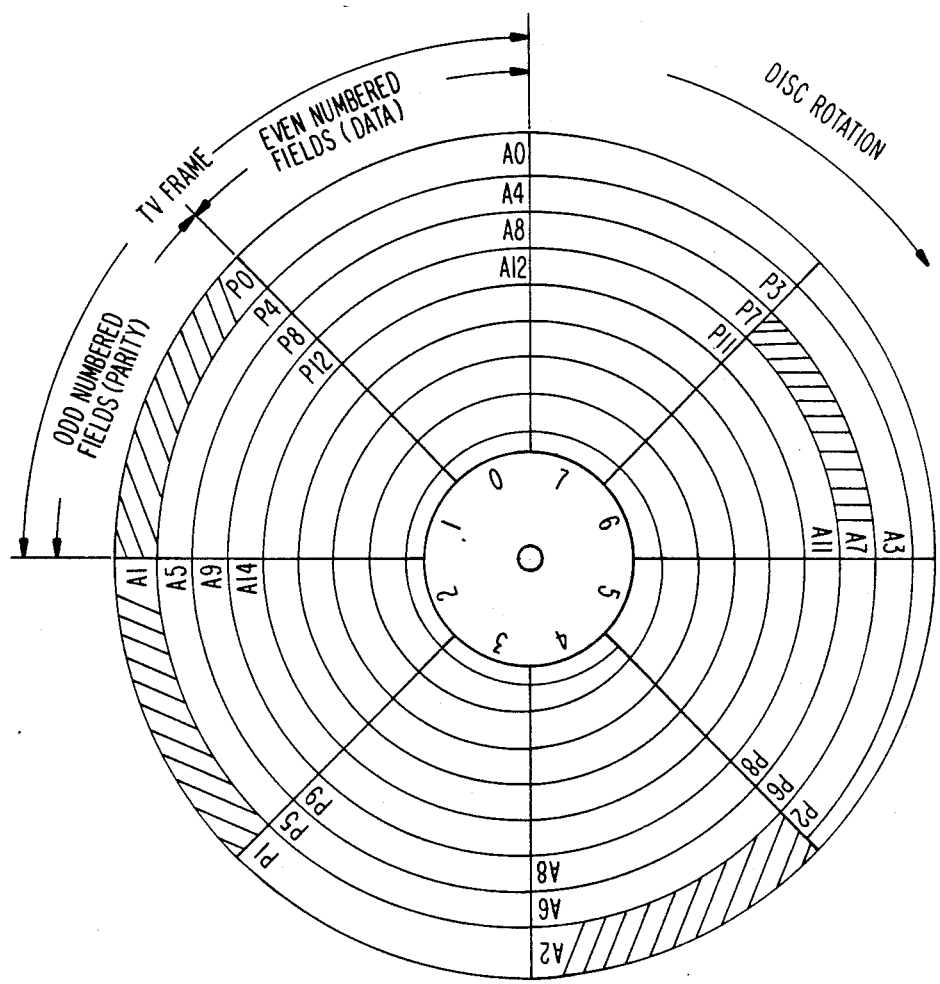
FIG. 5 is a simplified representation of a video disc record embodying the invention illustrating the convolutional code data and parity distribution.

FIG. 5 illustrates how the program data and parity information are distributed physically on a CED (eight sector, four frame per revolution) video disc record. Note that the parity data (Po, in sector 1) always preceeds the data from which it is generated (A1, sector 2; A2, sector 4; and A7, sector 6). It will be noted also that the parity and related data are "spread", so to speak, over more than one revolution of the disc. This is illustrated by shading the sectors in the following example. A7, for example, is recorded on the thirteenth field after Po. This distribution of data with respect to the corresponding parity information enables correction of any three "erasures" near each other and, in fact, up to thirteen "erased" (unreadable) codes in a row can be constructed if the preceeding codes are all good (no errors). In addition, any two of the eight sectors of the video disc can have all codes erased (e.g., by a radial scratch on the disc) and all of the erased data may be reconstructed using the prediction, direct reading and reconstruction techniques discussed in connection with FIG. 4. (Hardware and software examples of data recovery are discussed subsequently). Also, as will be discussed, the data correction capabilities of the program code are extensible to even higher levels of correction by means of a "chaining" technique.

Encoding System

Figure 6:
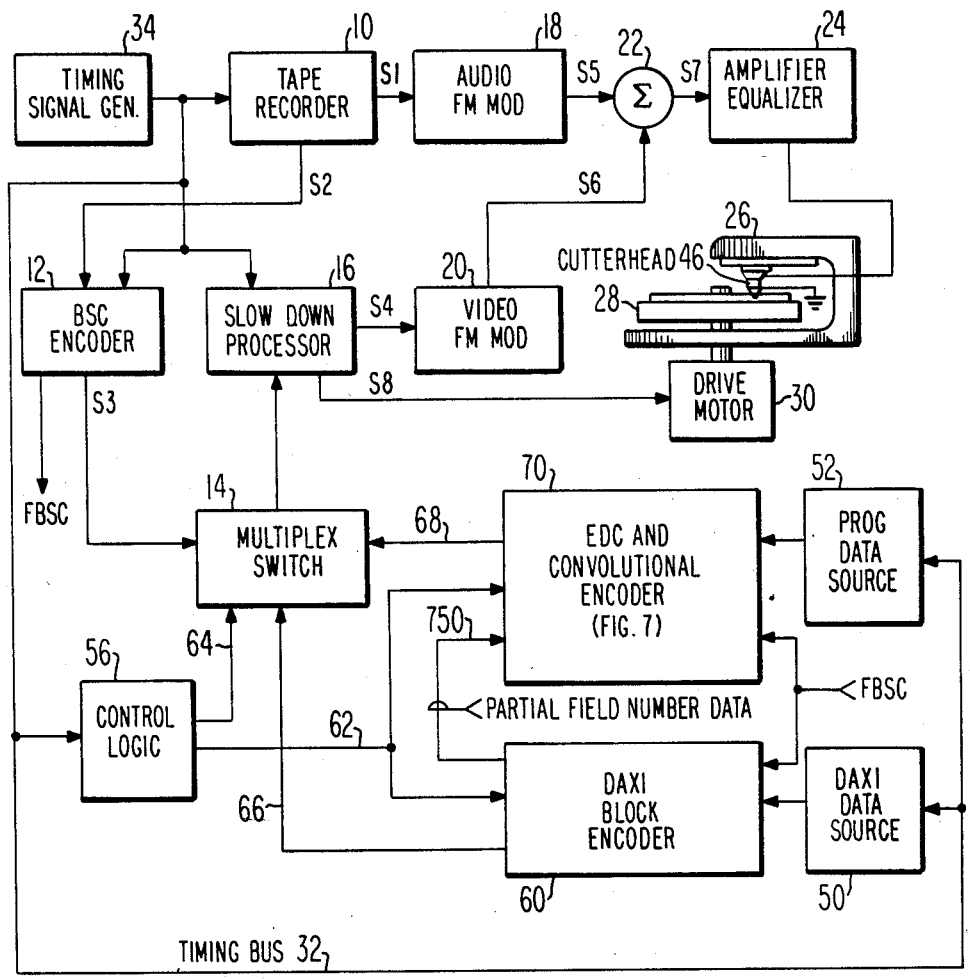
FIG. 6 is a block diagram of a video disc mastering system embodying the invention.

The video disc mastering system of FIG. 6 includes a video tape recorder 10 for providing a source of audio signal S1 and video signal S2 to be recorded. Recorder 10 is preferably a slow motion recorder provided with automatic scan tracking (AST) to facilitate mastering at half rate (one half normal playback speed) using the skip field mastering technique described in detail in U.S. Pat. No. 4,277,796 of M. Ross entitled "SLOW DOWN COLOR PROCESSOR FOR VIDEO DISC MASTERING USING A SPECIAL MODE VTR". The video signal S2 is applied to a buried subcarrier (BSC) encoder 12 which, preferably, is of the type described in the aforementioned Pritchard Pat. No. 3,872,498. In the BSC format chrominance information is represented by a color subcarrier of the general form employed in the well known NTSC format but buried in a lower portion of the video band rather than being located in the high end of the luminance signal band. An illustrative subcarrier frequency choice is in the vicinity of 1.53 MHz with the color subcarrier sidebands extending plus or minus 500 KHz thereabout and with the luminance signal band extending well above the highest color subcarrier frequency (to 3 MHz, for example).

The BSC encoded video signal S3 is applied via a multiplex switch 14 to a video slow down processor 16 which preferably is of the type described in the aforementioned Ross patent. Briefly, in the Ross system selected fields of the redundant field (slow motion) video signal S3 are stored in a memory in processor 16 at a standard clock rate and recovered at a lower clock rate that is inversely proportional to the number of times each field is repeated so as to produce a non-redundant video output signal (S4 here) of reduced bandwidth. The bandwidth of the audio signal S1 is reduced by the same factor as the video signal (one half) during operation of recorder 10 in the slow motion mode. The audio signal S1 and the processed video signal S4 are applied to respective frequency modulators 18 and 20 and the resultant frequency modulated carrier waves (signals S5 and S6) respectively, are combined in a summing circuit 22 to form a resultant composite recording signal S7 processing the full informational content of the original audio and video signals.

The recording signal S7 is applied via an amplifier/equalizer 24 to the cutterhead 46 of a recording lathe 26. The turntable 28 of lathe 26 is rotated by a drive motor 30 which receives half-rate (half-speed) drive signals S8 produced by processor 16 whereby full bandwidth master recordings may be made with a cutterhead of lesser bandwidth. Synchronization of recorder 10, encoder 12, processor 16 and remaining elements of the mastering system is provided by means of a timing bus 32 supplied with timing signals (e.g., vertical, horizontal, color subcarrier, etc.) produced by a timing signal generator 34. A generator suitable for producing NTSC format standard video timing signals is the Tektronics Model 146 NTSC Test Signal Generator. (For mastering in other formats such as PAL or SECAM an appropriate generator should be used).

The remaining elements of the mastering system encode digital data for recording along with the video signal on lathe 26. Two data sources are provided, namely, a DAXI data source 50 and a "program" data source 52. The sources receive timing signals from bus 32 and are selectively enabled by control signals produced by a control logic unit 56 which also receives timing signals from bus 32. DAXI data source 50, illustratively, is of the type described in the aforementioned Dieterich and other patents relating to DAXI coding and provides video field and band numbers and other suitable information relating to the video signal produced by recorder 10 (e.g., bits may be assigned to identify monophonic or stereophonic or bilingual material, etc.). As an illustration, field identification numbers may be produced by source 50 by counting recorded vertical field pulses provided by bus 32. Alternatively, source 50 may be coupled to receive a SMPTE time code signal provided by recorder 10 and "compute" the corresponding field numbers therefrom. Encoder 12 includes heterodyne circuits which convert the 3.58 MHz color subcarrier reference frequency to 1.53 MHz (FBSC). The FBSC signal is supplied to a DAXI encoder 60 and to an EDC and convolutional encoder 70 which encode the data produced by sources 50 and 52 in synchronism with FBSC as a data clock reference.

Program data source 52 may comprise, illustratively, a disc memory or other suitable source of digital data to be recorded on the video disc for ultimate use by an external device coupled to a disc player. For purposes of illustration and explanation it will be assumed that source 52 provides data in word lengths of 64 bits which corresponds to eight bytes of eight bits each. Data for encoders 60 and 70 are loaded under the control of control logic unit 56 by means of a control bus 62. Unit 56 may comprise, illustratively, a counter for counting field lines and a decoder for identifying lines in the vertical interval where the DAXI data and the program data words are to be recorded.

Bus 64 from unit 56 controls switch 14 which normally couples video signal S3 to processor 16. During DAXI and program time intervals (FIGS. 1 and 2) of fields selected for storage in processor 16, logic unit 56 sends control signals to encoders 60 and 70 (via Bus 62) to supply encoded data via conductors 66 and 68, respectively, to switch 14 and changes over the switch position during the appropriate line intervals of the vertical blanking interval to sequentially record the DAXI and program (encoded) data with the timing as shown and described with reference to FIGS. 1 and 2.

Figure 7:
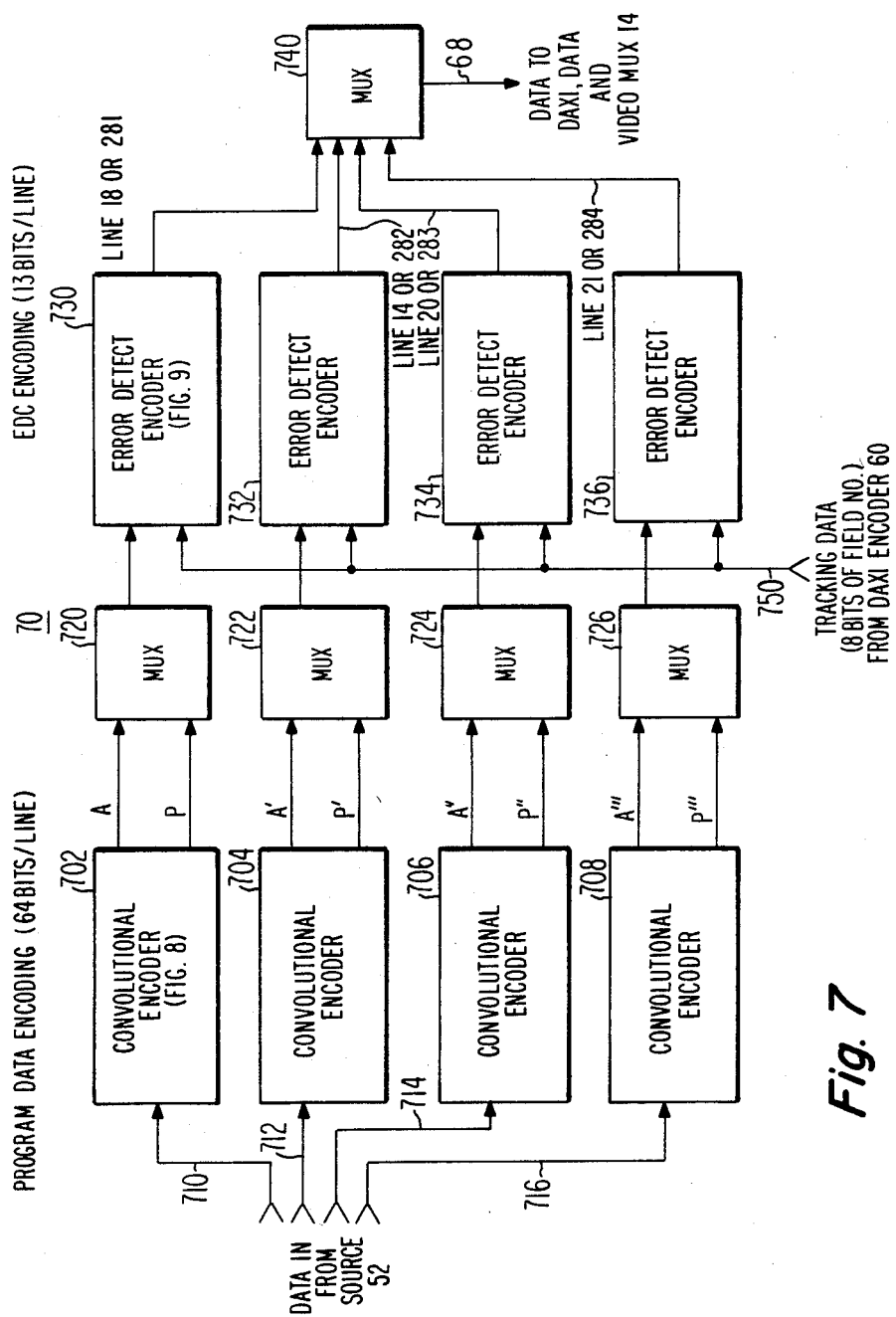
FIG. 7 is a detailed block diagram of the error detection and convolutional encoding portion of FIG. 6.

FIG. 7 is a detailed block diagram of encoder 70. To simplify the drawing and enhance its clarity the clocking (FBSC) and switch control signal lines (Bus 62) are omitted but will be discussed in detail. This specific encoder is designed to encode four lines of program data in the vertical blanking interval in the DAXI PLUS FOUR format previously described in the section entitled "Code Format".

The data A, A', A" and A''' from source 52 is supplied in serial form to four convolutional encoders 702-708 via conductors 710-716, respectively. Encoder 702 convolutionally encodes the 64 bits of A data in accordance with the parity equation for $P_n$ of FIG. 3 and provides the program data (A) and parity data (P) to the inputs of a multiplex switch 720. Switch 720, under the control of logic unit 56, selects the A data during even numbered fields and selects the P data during odd numbered fields. The selected data is then applied to an error detection encoder 730 (shown in detail in FIG. 9) which adds a 13 bit EDC to each 64 bits of program data (line 18) or parity data (line 281). Switches 722-724 and EDC encoders 732-736 are similarly connected for processing the program and parity data of encoders 704-708, respectively. The outputs of encoders 730-736 comprises 77 bit serial words which are selected by multiplex switch 740 for application via conductor 68 to switch 14 for recording after each DAXI line. Encoders 730-736 all receive partial field number data from DAXI encoder 60 via a bus 750. As will be explained, this data comprises a subset of the complete (18 bit) field number of the DAXI code.

Summarizing the operation of encoder 70, the program information from source 52 is convolutionally encoded in encoders 702-708 to provide "A" and "P" data blocks of 64 bits per line. During even numbered fields encoders 730-736 append a 13 bit EDC to each program data block, giving a total block length of 77 bits as in the DAXI code. During odd numbered fields the 13 bit EDC is appended to each 64 bit parity block. Switch 740 (controlled by logic unit 56) sequentially selects the four encoded program data lines (even fields) or parity lines (odd fields) for recording after each DAXI line with the timing shown in FIGS. 1 and 2 with respect to the DAXI line.

Figure 8:
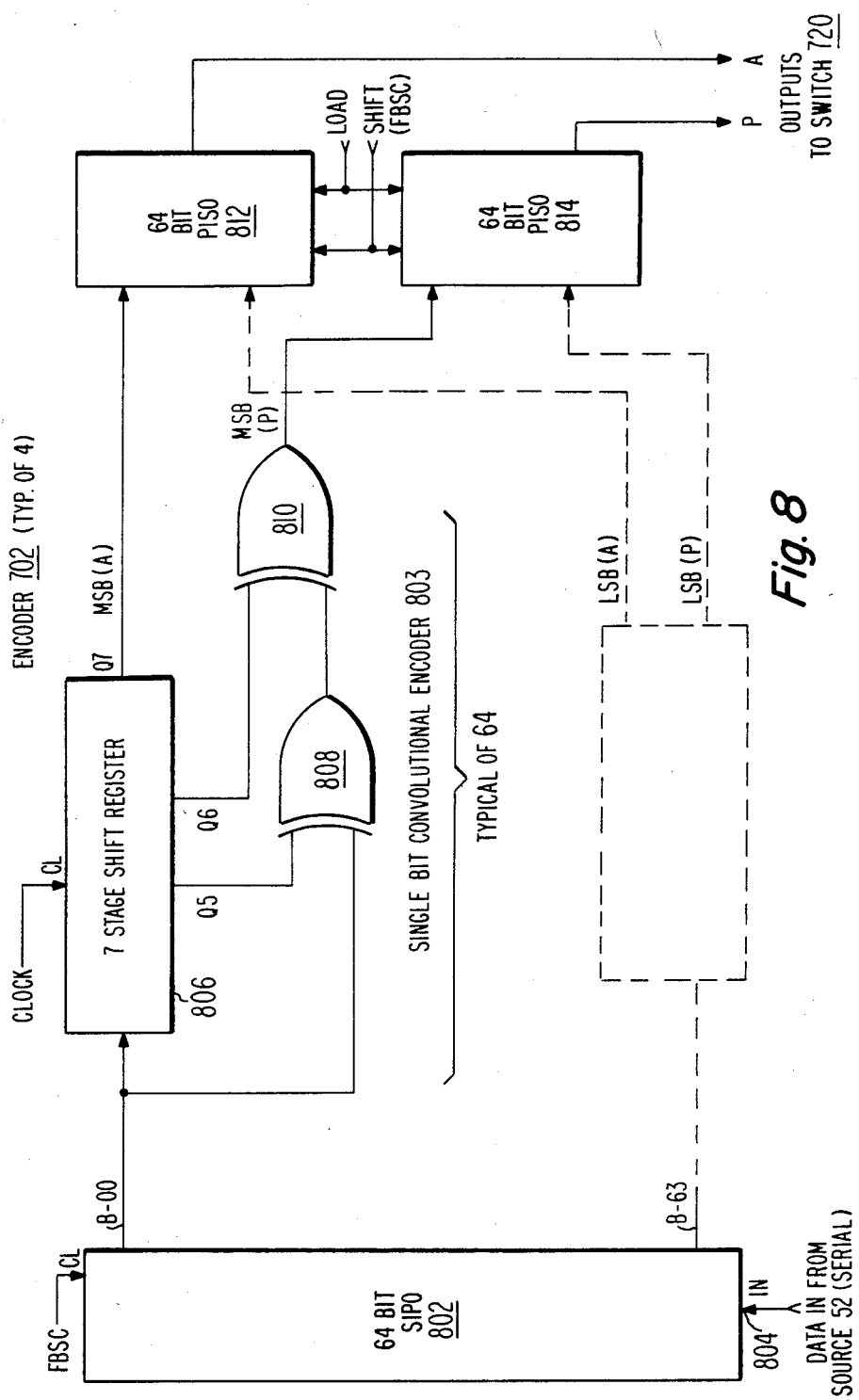
FIGS. 8 and 9 are detailed block diagrams of portions of the encoding system of FIG. 7.

FIG. 8 provides a detailed example of encoder 702 of the four (identical) convolutional encoders (702-704) of FIG. 7. The encoder comprises a serial-in parallel out (SIPO) shift register 802 which is "loaded" at the FBSC clock rate (1.53 MHz). Serial data from source 52 is applied to the input 804 of SIPO 802, which converts the program data to parallel form at 64 output taps B-00 through B-63. Once SIPO 802 is loaded, the data at each tap is shifted through a separate single bit convolutional encoder 803 which receives 64 clock pulses once per recorded video frame. For clarity, only one single bit convolutional encoder 803 is shown. The output (Q7) of the last stage of seven bit shift register (806) represents the first bit (MSB) of the A data which is applied (in parallel form) with the 63 other A data bits to a 64 bit parallel in serial out (PISO) shift register (812). The PISO 812 is loaded with the 64 bit data word before the data is sent in serial fashion to multiplex switch 720. The P (parity) data for this single bit convolutional encoder 803 is obtained by means of exclusive-OR gates 808 and 810. Gate 808 exclusive-OR's the input of register 806 with the output (Q5) of its fifth stage. Gate 810 exclusive-OR's the output of gate 808 with the output (Q6) of the sixth stage of register 806 and provides the parity output for the first bit (MSB) of the P data which is also applied with the remaining 63 bits of P data in parallel form to PISO 814 and subsequently in serial form to multiplex switch 720.

To summarize the foregoing, the serial program data is converted to parallel form by SIPO 802 and then is shifted by sixty-four single bit convolutional encoders to provide the Ao data in parallel form to PISO 812 providing serial output to switch 720. Exclusive-OR gates operate on the input and fifth and sixth outputs of each shift register thereby providing the P data to PISO 814 for output to switch 720 in serial form and satisfying the parity equation of FIG. 3. Switch 720 (FIG. 7) alternately selects the A and P data on a field by field basis for application to the EDC encoder.

EDC Encoding

Figure 9:
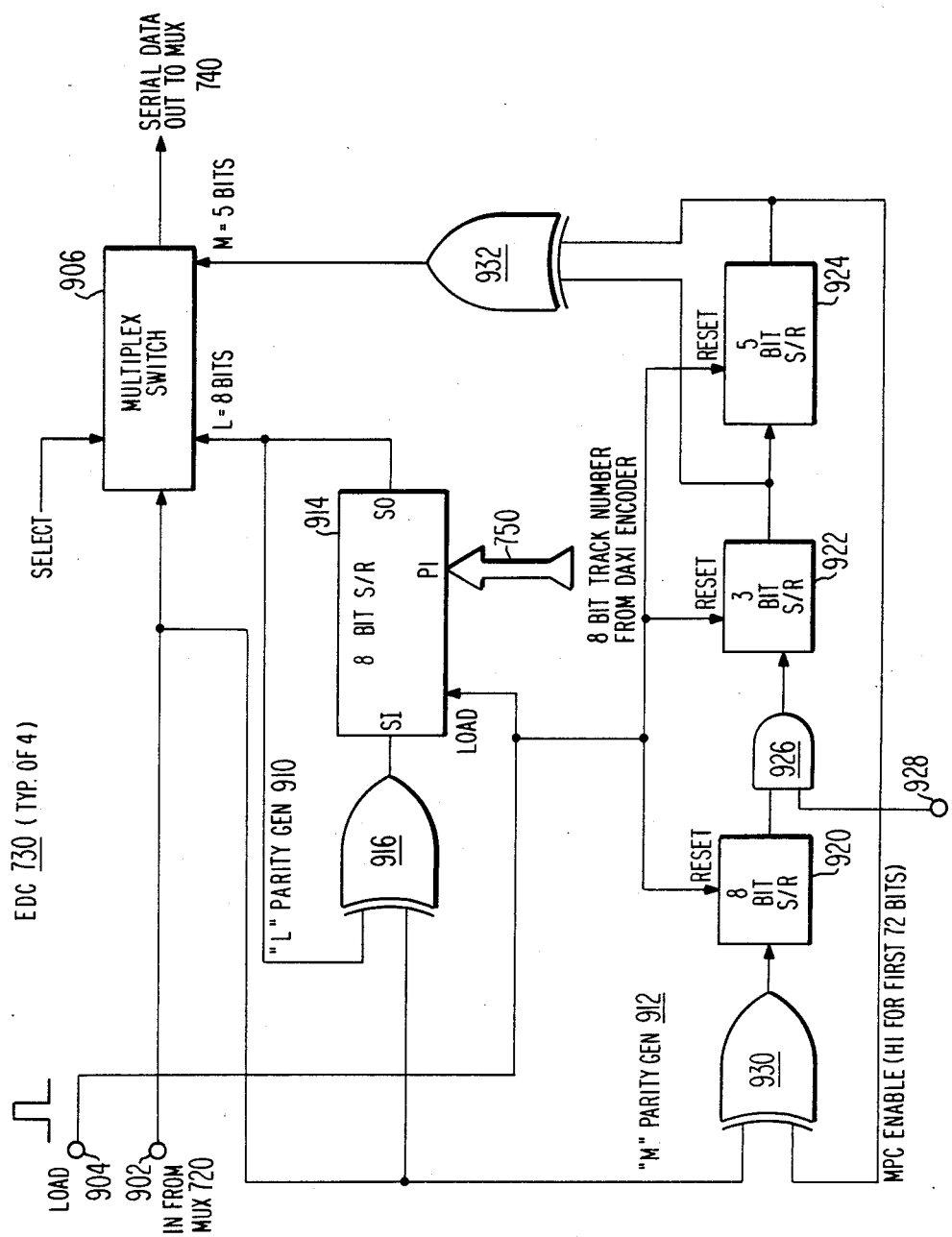

FIG. 9 is a detailed block diagram of one of the four error detection encoders (730) of FIG. 7. The data (A or P) selected by switch 720 (FIG. 7) is input at terminal 902. A load pulse is supplied to terminal 904 from control logic unit 56 at the beginning of line 18 for program data, A, and at the beginning of line 281 for the parity data, P.

The data from terminal 902 is applied to one input of a multiplex switch 906 which receives a selection control signal from control logic unit 56 to control sequential selection of the input 902 data (64 bits) and two sources of EDC data (totaling 13 bits). Switch 906 provides the means for appending the 13 bits of EDC to the 64 bits of program or parity data and supplies the resultant 77 bit word to multiplex switch 740 (FIG. 7) which, in turn, sequentially selects the outputs of EDC encoders 730-736 during the first four lines after the DAXI code.

As mentioned, the EDC code is produced by two sources. One source, 910, will be referred to herein as the "L" (longitudinal) parity generator and provides 8 of the 13 bits of the EDC. The L generator generates parity from all 64 serial bits of the data from terminal 902 and 8 bits (parallel) of the field number provided by the DAXI encoder 60 (FIG. 6). The specific 8 bits which are used are the fourth through the eleventh bits of the 18 bit DAXI field number. This subset of the complete field identification number identifies 256 convolutions of the groove or information track. The least signified 3 bits of the full field number identifies the eight sectors on the disc (sectors 0-7, FIG. 5) and are not used in the L parity generation.

The reason for using partial field number data when generating the L-parity check is to convey groove or tracking information along with the parity data so that tracking information may be recovered in a video disc player by means of the program code even though the complete track number provided by the DAXI code may be lost (unreadable). This information is conveyed, advantageously, without adding any more bits to the 77 bit code by pre-setting the L generator as will be described.

The L parity generator comprises an 8 bit shift register 914 and an exclusive-OR gate 916. Register 914 has a preset input (PI) coupled via bus 750 to receive the 8 bit (track number) portion of the field number produced by the DAXI encoder. The 8 bits are loaded into register 914 by means of the "load" pulse applied to terminal 904. The signal from terminal 902 is applied to the serial input (SI) of register 914 via gate 916. The serial output (SO) of register 914 is fed back to gate 916 for forming the parity "addition" and is also connected to a second input of switch 906 for appending 8 bits of the EDC to the 64 bits from terminal 902.

The 8 "L" parity bits are generated and appended to the 64 data (or vertical parity) bits as follows. First, after loading register 914, switch 906 is set to connect data at terminal 902 to MUX 740 (FIG. 7). Then 64 clock pulses are applied to both registers, register 914 and to the selected PISO (812 or 814) of encoder 702. This causes all 64 bits of data (or parity) to be shifted out of the encoder via switch 906 and at the same time the 64 bits are summed with the contents of register 914 by means of exclusive-OR gate 916. At the end of the 64th clock pulse register 914 contains the 8 bit "L" parity check code which is based on the partial groove number and the 64 data (or parity) bits. At this time switch 906 is changed over to select the output of register 914 and 8 more clock pulses are supplied to register 914 thereby appending the 8 bit L-check code to the preceeding 64 bits of data (A) or parity (P) bits.

The remaining element of encoder 730 comprises the M-parity generator 912 which provides the last 5 bits of the 13 bit EDC code. The "M" stands for "mixed" parity, as will be explained, because 8 parity bits are generated representing the exclusive-OR of all even numbered bytes of data or parity bits applied to terminal 902 and 3 of the eight bits are combined (by exclusive-ORing) with the remaining 5 to provide a "mixed" total of 5 bits. The compression, so to speak, of 8 bits into 5 bits is done to make the total number of L and M parity bits of the EDC code equal to 13. This, when added to the eight bytes (64 bits) of the convolutionally encoded data exactly equals the total number of bits (77) in the DAXI code (see FIGS. 1 and 2) and provides the advantage of maximum program data packing density in NTSC recording when using a 1.53 MHz bit clock based on the buried subcarrier (burst) frequency.

In more detail, M parity generator 912 comprises a cascade connection of an 8 bit, a 3 bit and a 5 bit shift register (920, 922, 924, respectively). The reset inputs of registers 920-924 are connected to terminal 904 so that these registers are cleared by the load pulse at the same time that register 914 is loaded with the 8 bit track number. An AND gate 926 is interposed between registers 920 and 922 for controlling data flow therebetween in response to an MPC (mixed parity code) ENABLE signal applied to terminal 928 that is coupled to an input of gate 926. The MPC ENABLE signal is produced by timing signal generator 56 (FIG. 6) and is high (logic 1) for the first 72 of the 77 bits of each line that is encoded. An exclusive-OR gate 930 receives the data from terminal 902 and the output of register 924 and applies the exclusive-OR thereof to the input of register 920. A five bit mixed parity output signal M is produced by another exclusive-OR gate 932 having inputs connected to the outputs of registers 922 and 924 and having an output connected to the third input of switch 906.

In operation, the 64 bits of data are shifted through registers 920-924 and fed back to gate 930 which forms the EX-OR or parity of the 64 data bits. During the next 8 clock cycles the output PISO of encoder 702 is empty and so gate 930 simply recirculates the M parity bits putting the contents of register 920 into registers 922 and 924. Then, after the 72nd clock cycle the MPC ENABLE signal goes low disabling gate 926 and effectively disconnecting register 920 from 922.

At this point registers 920–924 contain 16 bits of parity data. Registers 922 and 924 contain parity bits of all even numbered bytes of the 64 bit data word and register 920 contains parity of the odd numbered bytes. With gate 926 disabled, switch 906 changes over to select the M parity data from gate 932. There are 8 bits stored in registers 922 and 924. This is "compressed" to 5 bits by gate 932 during the next five clock cycles which exclusive OR's 3 bits (and 2 zeros from disabled gate 926) from register 922 with the 5 bits from register 932.

In brief summary, the M parity generator is a 16 bits long FSR (feedback shift register) which generates 8 bits of parity for even bytes of the data word and 8 bits of parity for the odd bytes. The exclusive OR of the even numbered bytes contained in registers 922 (3 bits) and 924 (5 bits) totals 8 bits. These bits are compressed by gate 932 to 5 bits so that the EDC encoded word totals 13 bits (8 of L parity, 5 of M parity) which, when appended to the 64 data bits by switch 906 results in a DAXI length (77 bit) code line. The 8 bits of parity for the odd bytes are not used.

Decoding System

Figure 10:
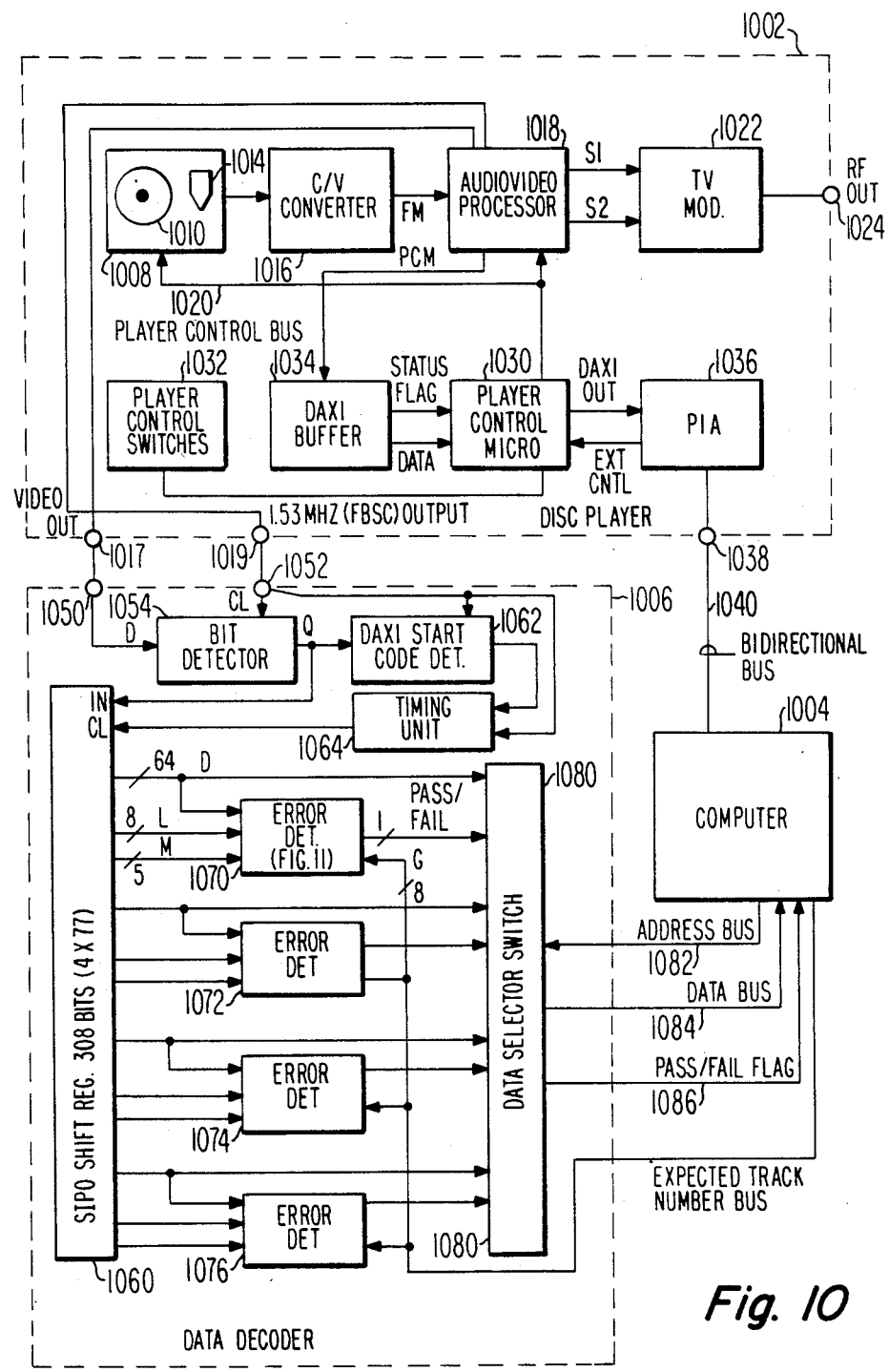
FIG. 10 is a block diagram of an interactive video disc system embodying the invention.

The interactive video disc system of FIG. 10 comprises a video disc player 1002, a computer 1004 and a data decoder 1006. The system is intended for use with video disc records encoded with data in the previously described "DAXI PLUS" format for use by the computer. In this specific example of the invention decoder 1006 is assumed to be physically located in the computer backplane. Alternatively, it may be in a "stand alone" configuration (i.e., in its own enclosure with its own power supply). A third alternative of placing the decoder physically inside the disc player has certain special advantages which are discussed subsequently in connection with FIGS. 16 and 17.

Player 1002 may be a conventional CED player such as the model SJT-400 manufactured by RCA Corporation and modified in minor respects as hereinafter described. Computer 1004 may be any suitable computer (or computer controlled game) having input/output ports for connecting external peripheral devices (e.g., printers, modems, or the like). Suitable "personal" computers include those made, for example, by IBM, Apple, and others. It is desirable but not necessary, that computer 1004 have a gen-locking capability if one wishes to mix computer controlled graphics with the player video signal.

Player 1002 (outlined in phantom) includes a turntable mechanism 1008 for rotating a video disc record 1010 and a pick-up transducer 1014 for recovering information signals from the disc. In the CED system, the information is stored in the form of topological variations of a spiral information track and recovered by sensing capacitance variations between a stylus in transducer 1014 and the record 1010. The output of transducer 1014 is applied to a capacitance-to-voltage (C/V) converter 1016 which produces an FM output signal representative of the recorded information. Such records and suitable circuits for implementing the C/V conversion are well known. See for example, U.S. Pat. No. 3,783,196 (Stanley), No. 3,842,194 (Clemens) and No. 4,080,625 (Kawamoto et al.).

The FM signal is applied to an audio/video processor 1018 which produces a baseband audio output signal S1 and a baseband composite video output signal S2. Processor 1018 has an input connected to a player control bus 1020 for receiving squelch signals for muting the audio and video signals under certain player operating conditions (e.g., "pause"). Bus 1020 also conveys turntable motor and tracking control signals to mechanism 1008. Pyles et al., in U.S. Pat. No. 4,286,290 entitled "FAST RECOVERY SQUELCH CIRCUITS FOR A VIDEO DISC PLAYER" which issued Aug. 25, 1981, discloses a suitable implementation of processor 1018 which provides timebase error correction circuitry and format conversion circuitry for converting the recovered video signal from the "buried subcarrier" format proposed by Pritchard in U.S. Pat. No. 3,872,498 to the NTSC format. Carnt et al., in U.S. Pat. No. 4,200,881 describe processors suitable for recording and reproducing composite video signals of PAL format.

The baseband audio and video signals S1 and S2 produced by processor 1018 are applied to the sound and picture carrier modulation inputs of a TV modulator 1022 which has an RF output terminal 1024 for connection to the antenna input terminal of a conventional television receiver for displaying sound and picture information recovered from disc 1014. An integrated circuit suitable for use as modulator 1022 is the type LM 1889 available, for example, from National Semiconductor, Inc.

A player control microprocessor 1030 provides various supervisory and information display control functions. The control functions (supplied via bus 1020) include, illustratively, control of the radial position, elevation, velocity and direction of movement of pick-up transducer 1014 relative to disc 1010 and selective squelching of the audio and video signals produced by processor 1018. Some of the functions are initiated manually by means of a player control switch unit 1032 coupled to an input port of microprocessor 1030. Manually initiated functions include, illustratively, play, pause, slow scan forward or reverse, caption display on/off etc. Upon closure of one of the user activated switches in unit 1032, microprocessor 1030 addresses its internal read only memory (ROM) and fetches an appropriate sequence of instructions resident in the memory for effecting the desired control function.

DAXI information (e.g., field numbers, band numbers, etc.) is conveyed to microprocessor 1030 by means of a DAXI BUFFER integrated circuit 1034 having an input coupled to a PCM data output of processor 1018 and having outputs coupled to supply data and data status flag signals to input ports of microprocessor 1030. When a DAXI code word is received without error, the status flag is SET and microprocessor 1030 processes the data for machine control purposes (e.g., detecting stop flags or end of record bits) and player display purposes (e.g., calculation of elapsed playing time from the field number data). Buffer 1034 and microprocessor 1030 are commericially available integrated circuits and are described in more detail in the previously mentioned DAXI related to U.S. Patents. Buffer 1034 is interfaced with a comb filter (not shown) in processor 1018 for detecting the PCM DAXI data as described in C. B. Dieterich's U.S. Pat. No. 4,275,416 entitled "PCM DETECTOR" which issued June 23, 1981.

Computer 1004 is interfaced with player 1002 via two circuit paths. The first path comprises a bidirectional data bus 1040 which connects to I/O port 1038 of a PIA (periphial interface adaptor) integrated circuit 1036 in player 1002. PIA 1036 receives DAXI data from microprocessor 1030, provides buffering, and sends the data to computer 1004. It also receives control signals (e.g., pause, play, kick stylus, etc.) from computer 1004 and supplies them to microprocessor 1030 so that the player 1002 may be controlled by manipulation of the keyboard or "joy stick" controls of the computer. Bus 1040, in short, provides the path for sending DAXI data to computer 1004 and for sending player control signals to the player. Although it does not convey any of the convolutionally encoded "program data" which follows the DAXI code, it does provide (in this specific example of the invention) an important "key" for detecting errors in the convolutionally encoded program data. This key is the DAXI field number. As will be explained, 8 bits (a subset of the 18 bit number) of the DAXI field number are used in data decoder 1006 for providing a double check, so to speak, on the track number. In a later example of the invention, these bits also provide track error correction (TEC) as well as track error detection.

The second interface path for computer 1004 with player 1002 comprises data decoder 1006 which provides data detection, serial-to-parallel data conversion and error detection for the convolutional code. Predictive and reconstructive error correction for the convolutionally encoded data is provided by computer 1004 in accordance with the program flow charted in FIGS. 12-15 as will be explained.

The convolutionally encoded data (lines 18-21, FIG. 1, and 281-284, FIG. 2) is obtained from player 1002 by means of an output terminal 1017 which is coupled to the output of the video FM demodulator in audio/video processor 1018. The video output signal is obtained prior to comb filtering in player 1002 to avoid the necessity of separating data lines with blank lines, as previously explained. To facilitate data detection in decoder 1006, the 1.53 MHz buried subcarrier reference frequency (FBSC) produced by an FBSC burst locked oscillator in processor 1018 is applied to a further output terminal 1019 of player 1002. As previously explained, the data is encoded synchronously with the FBSC reference frequency.

The non-comb filtered video signal and FBSC clock signal provided at terminals 1017 and 1019 are applied to input terminals 1050 and 1052, respectively, of decoder 1006, which in turn are connected to the data (D) and clock (CL) inputs of a bit detector 1054 that, illustratively, may comprise a "D" (data) type flip flop. At each positive transition of CL, the Q output of the flip flop assumes the level of the signal at its "D" input. Thus, if the video signal is at white level (high) when the clock transition occurs, the Q output will switch to a high (logic one) state. Conversely, Q will assume a low (logic zero) state when the video signal is low at the clock transition time. A "data slicer" or comparator (not shown) may be interposed in the video signal path to bit detector 1054 for enhancing the detector noise immunity.

The detected (PCM) data at the Q output of detector 1054 is applied to the data input terminal of a 308 bit shift register 1060 and to the input of a DAXI start code detector 1062. Detector 1062 may be a DAXI buffer integrated circuit (available from RCA Corporation) which includes a SIPO register and exclusive-OR gates for detecting the 13 bit Barker framing code sequence 1F35 (Hex) or 1 1111 0011 0101 (binary). When the DAXI start code is detected (line 17 of even numbered fields, line 280 of odd numbered fields) detector 1062 enables a timing unit 1064 which gates the FBSC signal to the clock input of register 1060 in accordance with the timing shown in FIGS. 1 and 2 thereby shifting the 4 lines of data (77 bits/line) into the 308 bit register. All four lines of data (or parity) bits are thereby converted to parallel form for error detection processing.

There are four error detectors 170-176 in decoder 1006, one detector for each line of program data or parity data (recall that the program and parity data alternate on a field by field basis). Each detector receives as inputs: 64 bits of data (or parity), 8 bits of the longitudinal (L) error check code, 5 bits of the mixed (M) parity check code and 8 bits (G) of the expected track number code. The G data is provided to detectors 170-176 from an 8 bit parallel output port of computer 1004 which receives the DAXI data via bus 1040 from player 1002. When the DAXI code is detected in player 1002, the complete 18 bit field number is sent to computer 1004 which stores it and supplies the eight lower ordered bits above the least significant 3 bits to detectors 170-176 via an "expected" track number bus (8 bit parallel). Having computer 1004 store the "G" data is a convenience but is not necessary to the invention. An alternative would be to add 8 more stages to the 308 bit SIPO register and store the G (expected or DAXI track identification number) data there. This would require modifying timing unit 1064 to provide 8 clock pulses to SIPO 1060 47 clock cycles after detection of the 13 bit Barker start code (see U.S. Pat. No. 4,308,557 (Dieterich) for a detailed breakdown of the DAXI bit sequence).

In this specific example of the invention, error detectors 1070-1076 each provide a single output line designated "Pass/Fail". The pass/fail is a "flag" which identifies whether or not the associated 64 bits of program or parity data is completely free of errors. The flag status serves, as will be explained, as an instruction to computer 1004 to either accept the data as it is or to process the data to correct errors by predictive or reconstructive techniques.

The four pass/fail lines of detectors 170-176 and the four 64 bit parallel data lines of SIPO 1060 are applied to a data selector switch 1080 which receives address (selection) signals from computer 1004 via address bus 1082. Data and the respective pass/fail flag are supplied to computer 1004 via a data bus 1084 and a pass/fail flag conductor 1086.

To briefly summarize the foregoing operation of the interactive disc system, the DAXI data recovered from disc 1010 is sent to computer 1004 to keep the computer updated on the status of the player operating conditions including the video field numbers from which the disc playing time may be calculated. Convolutionally encoded program data is recovered prior to comb filtering in processor 1018, synchronously detected in bit detector 1054 and stored in SIPO 1060. The data, L parity and M parity bits together with the G data (from the DAXI code via computer 1004) are error detected to generate 4 pass/fail flags for the four 64 bit data words. Switch 1080, under computer control selects and passes the data and flags to the computer for final processing (error correction) and, ultimately, the fully corrected data is used by computer 1004 to operate interactively with player 1002.

Figure 11:
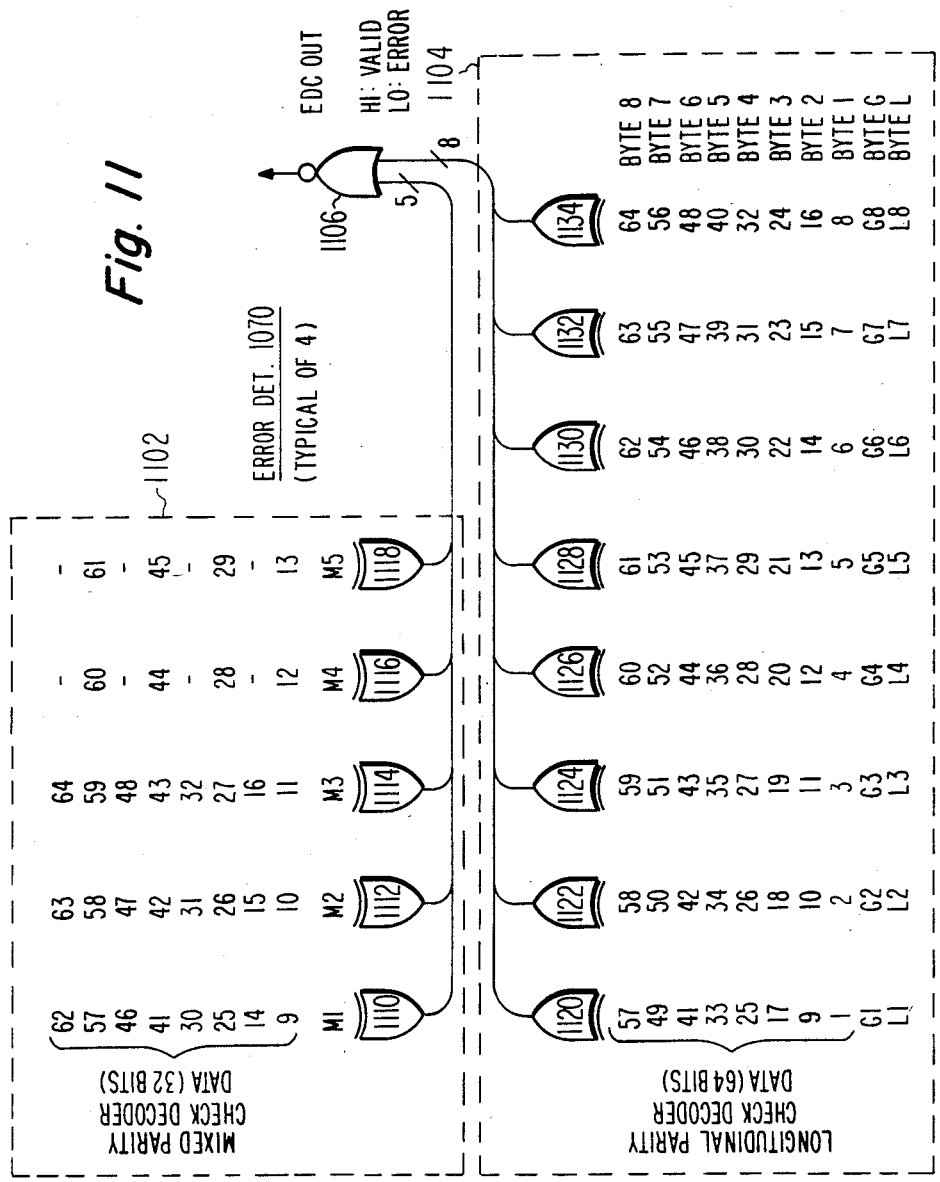
FIG. 11 is a block diagram of the error detection decoder of the system of FIG. 10.

FIG. 11 is exemplary of one way of implementing error detector 1070 (typical of 4 detectors) in a so called "hardware" configuration. Use of discrete logic elements or a dedicated LSI integrated circuit for error detecting, as compared with a "software" approach, provides an important speed advantage in that all error detection is done in parallel form. To accomplish the same result in "software" would require either an extremely fast microprocessor or a large number of slower ones.

Detector 1070 (typical of four) comprises a mixed parity check decoder 1102, a longitudinal parity check decoder 1104 and a 13 input NOR gate 1106. Five of the thirteen inputs to gate 1106 are provided by 5 exclusive-OR gates 1110-1118 in decoder 1102 and the remaining 8 inputs are provided by 8 exclusive-OR gates 1120-1134 in decoder 1104. If the output of any of the exclusive-OR gates is high (logic one), then the output of gate 1106 will be low. This signifies that an error has occurred. If the output of all of the exclusive-OR gates is low, then the output of gate 1106 will be high. This signifies that no errors have occurred in any bit position.

Considering now the details of the L and M decoders, the inputs of each exclusive-OR gate are identified by a listing beside each gate to simplify the drawing. In decoder 1104, gate 1120 receives the least significant bit (LSB) of each of the 8 bytes of the 64 bit data word and also receives the LSB of the 8 bit tracking data byte G from computer 1004 as well as the LSB of the L parity byte. The remaining 7 exclusive-OR gates are similarly connected to receive the remaining corresponding bits of the D, L and G bytes.

The M decoder has only 5 exclusive-OR gates because, as previously explained, the highest 3 significant bits of each 8 bit byte of data are "folded over" in the encoding process and "mixed" with the remaining 5 bits to compress the M parity check to 5 bits so that the entire parity word of 13 bits, when added to the data (or parity) word of 64 bits, will result in a total of 77 bits. This equals the length of the DAXI code and utilizes the maximum data packing density per line for the given data clock rate (1.53 MHz, NTSC; 1.52 MHz in PAL). The "foldover" of data bits is clearly visible in the array of bit numbers. For example, in the data byte 9-16, bits 9-13 are applied to gates 1110-1118 respectively and the higher ordered bits 14, 15 and 16 are applied to gates 1110-1114, respectively, along with the lower ordered bits 9, 10 and 11 for that data byte. In addition to receiving the data inputs, gates 1110-1118 also receive respective bits M1-M5 of the mixed parity check word.

Error Correction

As previously mentioned, error correction of the convolutionally encoded data is provided by computer 1004. Error detection was implemented in hardware (FIG. 11) to obtain the advantage of high speed parallel processing. Once the error flag is generated, however, processing may continue at the relatively low clock rates (e.g., one or a few MHz) characteristic of personal computers, "video games", or the like.

As mentioned in the discussion of FIG. 4, a first level of decoding of the convolutionally encoded data is based on the solution of one equation for one unknown. Notice that P0 XOR A1 XOR A2 XOR A7 equals zero (XOR is the bit-by-bit exclusive-OR of the 64 bit word as used in encoding). This means that if any one of the four words is unknown, it can be reconstructed by exclusive-ORing the other three as in the table of FIG. 4.

As an example, if decoder 1006 has just received A2 correctly and has P0 and A1 stored in the memory of computer 1004, then A7 can be predicted in the computer P0 XOR A1 XOR A2. Similarly, if A2 was missed due to a missing or invalid DAXI read, then A2 can be recovered by reconstruction when A7 is received because A2 equals P0 XOR A1 XOR A7.

Recovery of "erased" data need not be restricted to solving one equation in one unknown. Equations may be "chained" to provide multiple erasure recovery. For example, if there are erasures at A1 and A7 and if P0, A2, P5, A6 and A12 are known, then A1 may be obtained by first calculating A7 and then using A7, A2 and P0 to determine A1 as follows:

$$A7 = P5 \text{ XOR } A6 \text{ XOR } A12 \quad (1)$$

$$A1 = P0 \text{ XOR } A2 \text{ XOR } A7 \quad (2)$$

This is called second level correction. Notice that A12 must be received before A1 can be reconstructed resulting in a delay of 22 code words (the maximum delay for first level correction is 12 data words). Clearly, third and fourth levels of correction might be added. Each new level requires data words recorded later on the video disc record 1010 so the decoding delay increases.

The probability of disc error patterns occuring which require higher levels of decoding has been found to diminish very rapidly. It is herein recognized that an optimum choice is about three levels of error correction resulting in a decoding delay of about 30 fields (one-half second at the NTSC field rate).

In summary, a data word can be recovered in three general ways. It can be predicted by using previous words, it can be received directly (pass/fail flag indicates data valid) or it can be reconstructed from subsequent data words. How many of the subsequent data words are needed determines the decoding delay. The longer the delay, the lower the probability of not correcting lost data. An optimum delay is on the order of about 30 fields or 0.5 seconds. The foregoing error correction method is implemented in the system of FIG. 10 by means of computer 1004 programmed in accordance with the flow charts of FIGS. 12-15. A portion of the random access memory (RAM, not shown) of computer 1004 is set aside to provide memory space for 32 registers of 65 bits each (64 for data or parity words, 1 for an "EMPTY/FULL" flag bit) for each one of the four program data (A) and corresponding parity (P) lines. Since all lines are corrected in the same manner, the following discussion will consider one line (e.g., the A data line 18 and the P parity line 281) as exemplary of the correction process.

For purposed of discussion the storage registers set aside in the computer RAM are identified as An, Pn, An-1, Pn-1, . . . Pn-15. The registers are all assumed to be "empty" at the start of decoding and the EMPTY/FULL flag is set to EMPTY. When An is received and is valid (pass/fail flag indicates "pass"), it is loaded into location An and the EMPTY/FULL flag is set to FULL. All registers are then tested to see if ones can be found which have 3 FULL and 1 EMPTY register. If so, the word is reconstructed using exclusive-OR operations of FIG. 4, the EMPTY/FULL flag is set to FULL and the reconstructed (or predicted) word is stored in the register.

When Pn is received, the EMPTY/FULL flag for Pn is set appropriately from the pass/fail flag. The parity equation testing process is not repeated for Pn because Pn does not enter into any parity check equations using any An's stored in the memory. Instead, when Pn is received, An-14 is readout and sent to whatever device requires the data. (In this case, An-14 is simply sent to another location in the computer memory in which the "interactive" program data resides to be processed as needed when playing the disc). The register contents are then shifted by one so Ak is moved to Ak-1 and Pk to Pk-1 (K=0 to 14). The register, in other words, serves as a FIFO buffer. Locations An and Pn are flagged as EMPTY and the correction process is then repeated for the next A and P data words.

Figure 12:
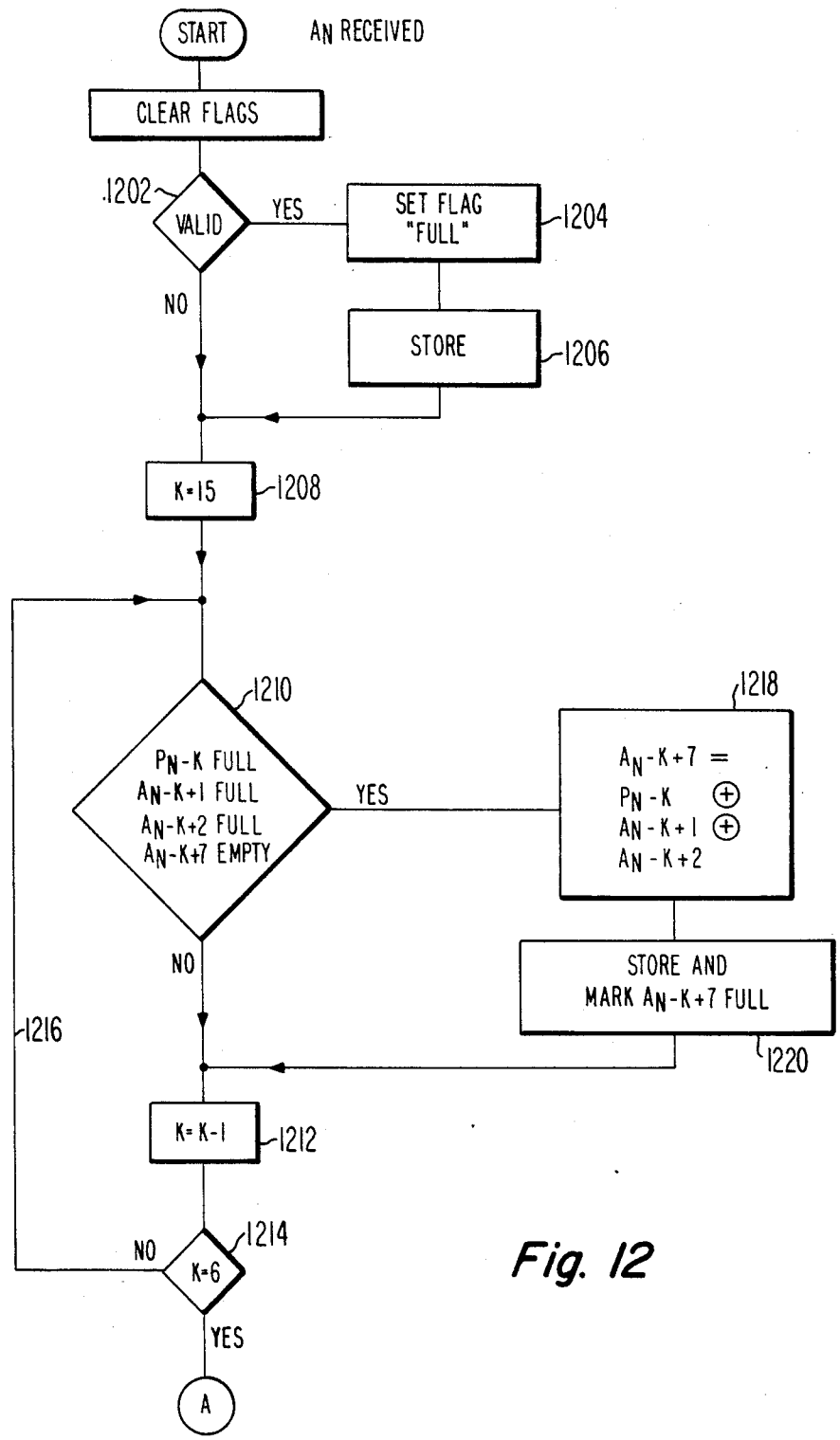
FIGS. 12, 13 and 14 are flow charts of a computer program for correcting data errors.
Figure 13:
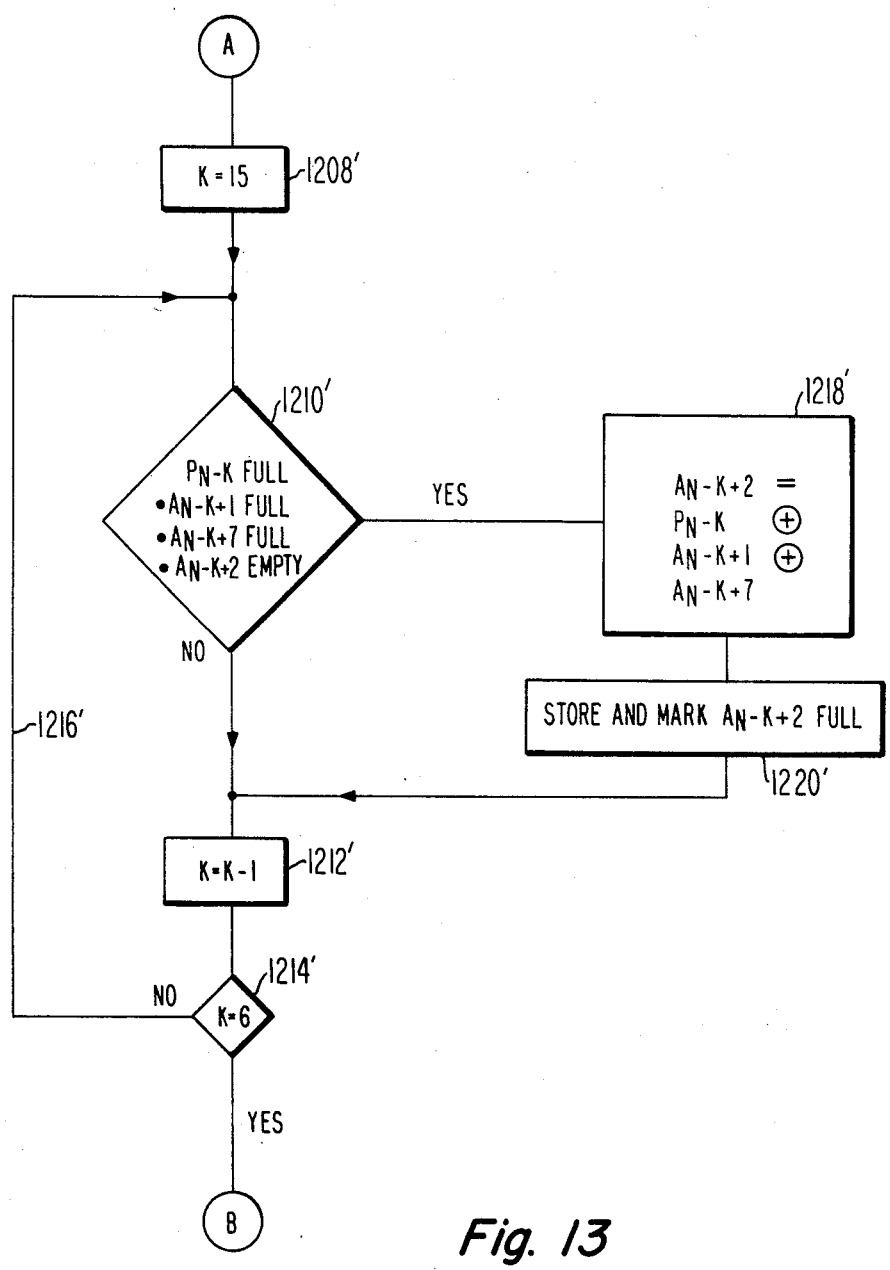
Figure 14:
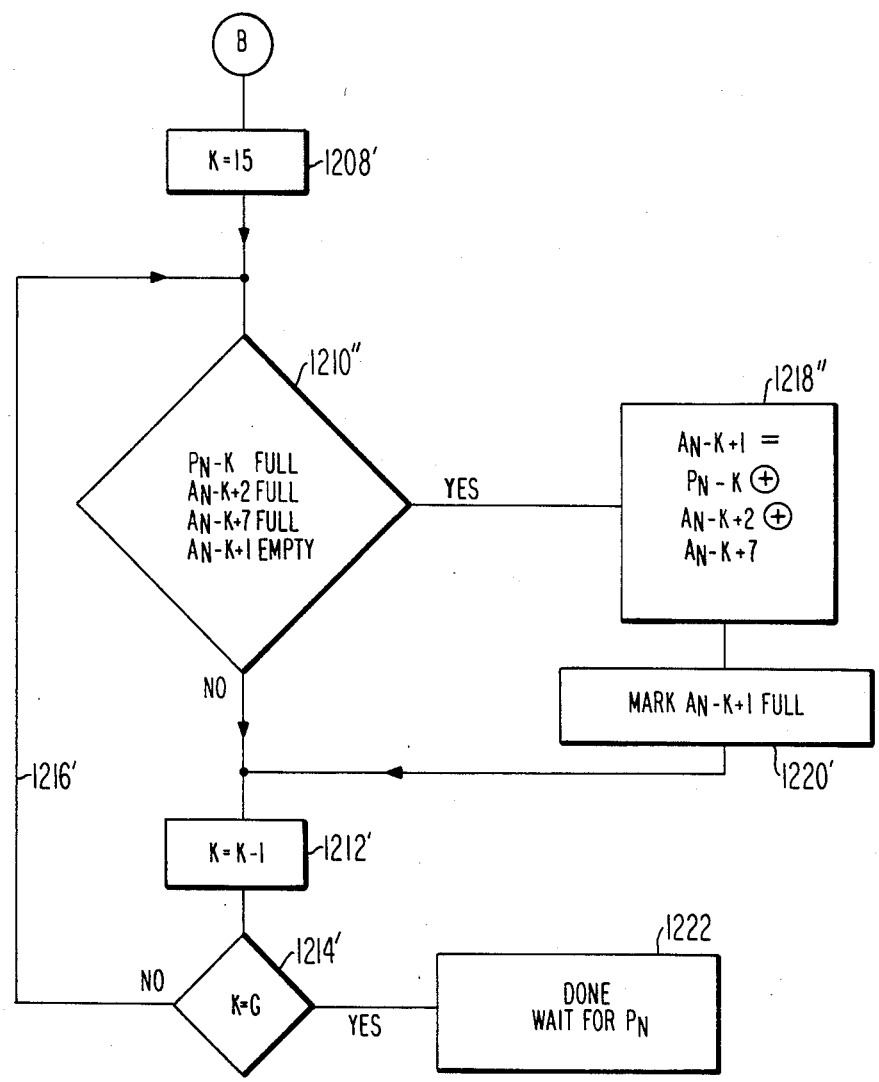
Figure 15:
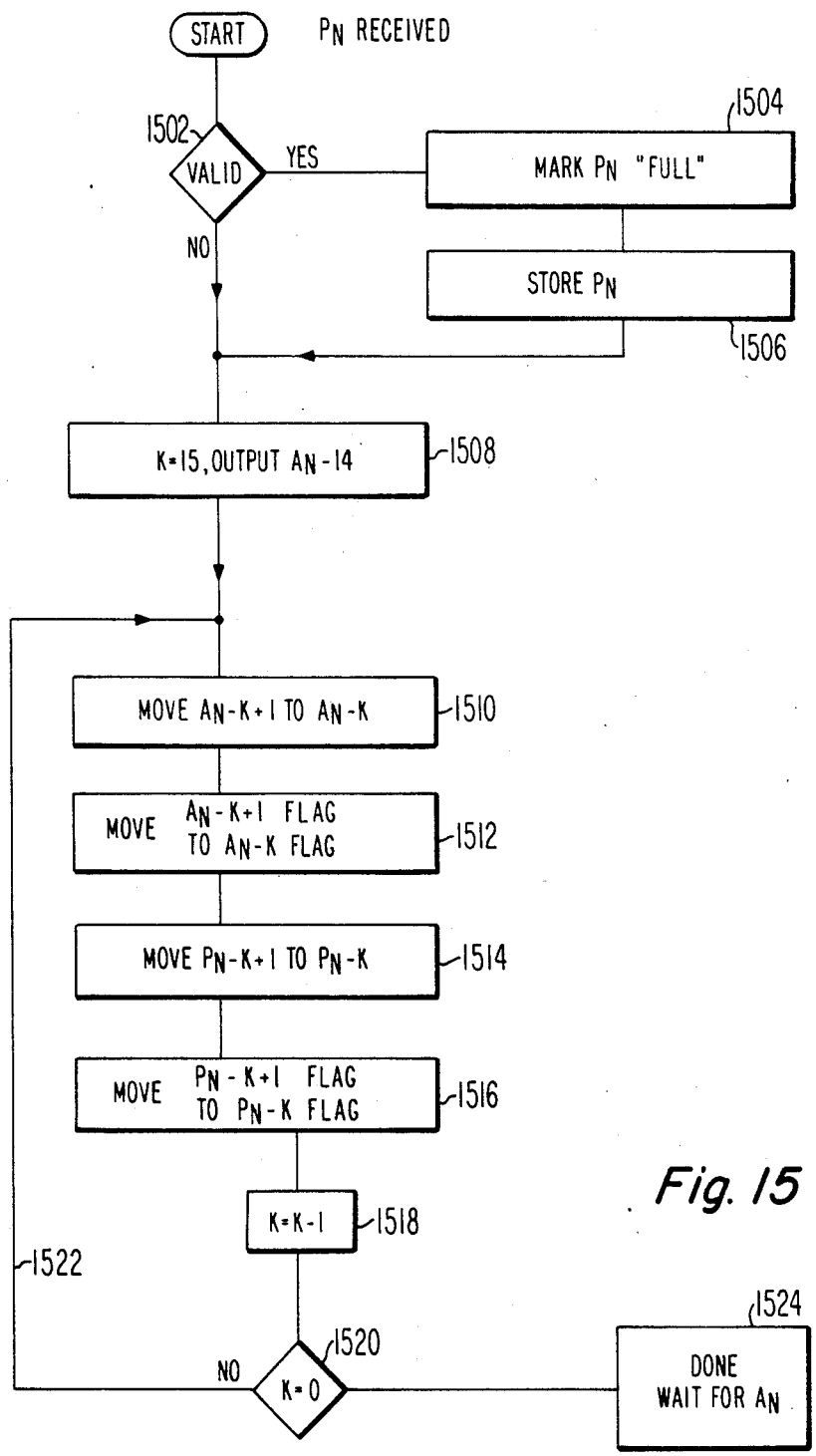
FIG. 15 is a flow chart illustrating parity control stack operations.

The foregoing error correction method is illustrated in more detail in the flow charts of FIGS. 12–14 for the An processing and FIG. 15 for Pn. In FIG. 12 all flags of the 30 registers are initially cleared (set to EMPTY). When the "A" program data is received its validity is tested (box 1202) by examination of the PASS/FAIL flag produced by error detector 1070. If the PASS/FAIL flag indicates that the 64 A bits are error free, then the "FULL" flag is set (Box 1204) for the first register and the flag and associated 64 bits of An data are stored there. Otherwise, the flag remains set at EMPTY. The next step comprises setting a constant K to 15 (Box 1208) and checking the register flags (Box 1210) to see if Pn-k, An-k +1, and An-k +2 are FULL and An-k +7 is EMPTY. If not, k is decremented by one (Box 1212) and if k is not equal to six (Box 1214) the flag test (Box 1210) is repeated via loop 1216. If at any time the 3 FULL 1 EMPTY register condition is found (Box 1210), then An-k +7 is calculated by exclusive-ORing Pn-k, An-k +1 and An-k +2 (Box 1218) and the data for An-k +7, thus predicted, is stored and the An-k +7 register flag is set to FULL (Box 1220). The decrementing process is then repeated until k equals 6 (box 1214). This completes the direct reading and storage operation for valid An data (Box 1202) and the reconstruction of invalid An+7 data (Box 1218).

FIG. 13 is a continuation of FIG. 12 and illustrates reconstruction of the An+2 data. The steps are the same as in FIG. 12 except that the flag EMPTY test (box 1210') is performed for An-k +2 and if satisfied (YES) then An-k +2 is determined by exclusive-ORing Pn-k, An-k +1 and An-k +7 (Box 1218). FIG. 14 is a continuation of FIG. 13 for reconstructing invalid An+1 data. The method is the same except for the flag test (An-k +1 EMPTY, box 1210") and the calculations (exclusive-ORing Pn-k, An-k +2, An-k +7) to obtain An-k +2 (Box 1218"). After the k=6 test, processing is halted (Box 1222) until Pn arrives during the next field.

The total delay for fully correcting the data is 30 fields which corresponds to 0.5 seconds (NTSC). If the data is all valid when decoding begins the directly read data (Box 1206, FIG. 12) is, of course, immediately useable but full error the correction capability is not realized until 30 fields have been processed. As previously noted, this has been found to be an optimum delay to achieve the desired WER for program data downloading. If the data delay of 30 fields is excessive and a higher WER is acceptable, then data may be transferred out from a location lower than An-14. For example, the delay may be reduced by a factor of two if An-7 is output by box 1508.

FIG. 15 illustrates the Pn processing steps and the stack (30 register) control operations which output the error corrected An data. The Pn processing comprises a test (Box 1502) of the pass/fail flag from the EDC (FIG. 10) to determine if errors are present. If Pn is valid, the Pn FULL/EMPTY flag is set to FULL (Box 1504) and Pn (and it status flag) are stored (Box 1506). Otherwise the flag remains set to EMPTY. After the Pn operations are performed, K is set to 15 and the oldest An (i.e., An-14) is output from the 30 register stack (Box 1508). The remaining data are shifted down one location in the stack (buffer) so as to provide first-in first-out (FIFO) retrieval of the An data. Specifically, An-K +1 is moved to An-k (Box 1510), the An-k +1 flag is moved to the An-k flag location (Box 1512), Pn-k +1 is moved to Pn-k, the Pn-k+1 flag is moved to the Pn-k flag location (Box 1516), k is decremented by 1 (Box 1520) and the process is repeated via loop 1522 until all data, parity and associated flags have been moved. After the k=0 test (box 1520), processing is halted (Box 1524) until the next field when the new An data occurs.

Figure 16:
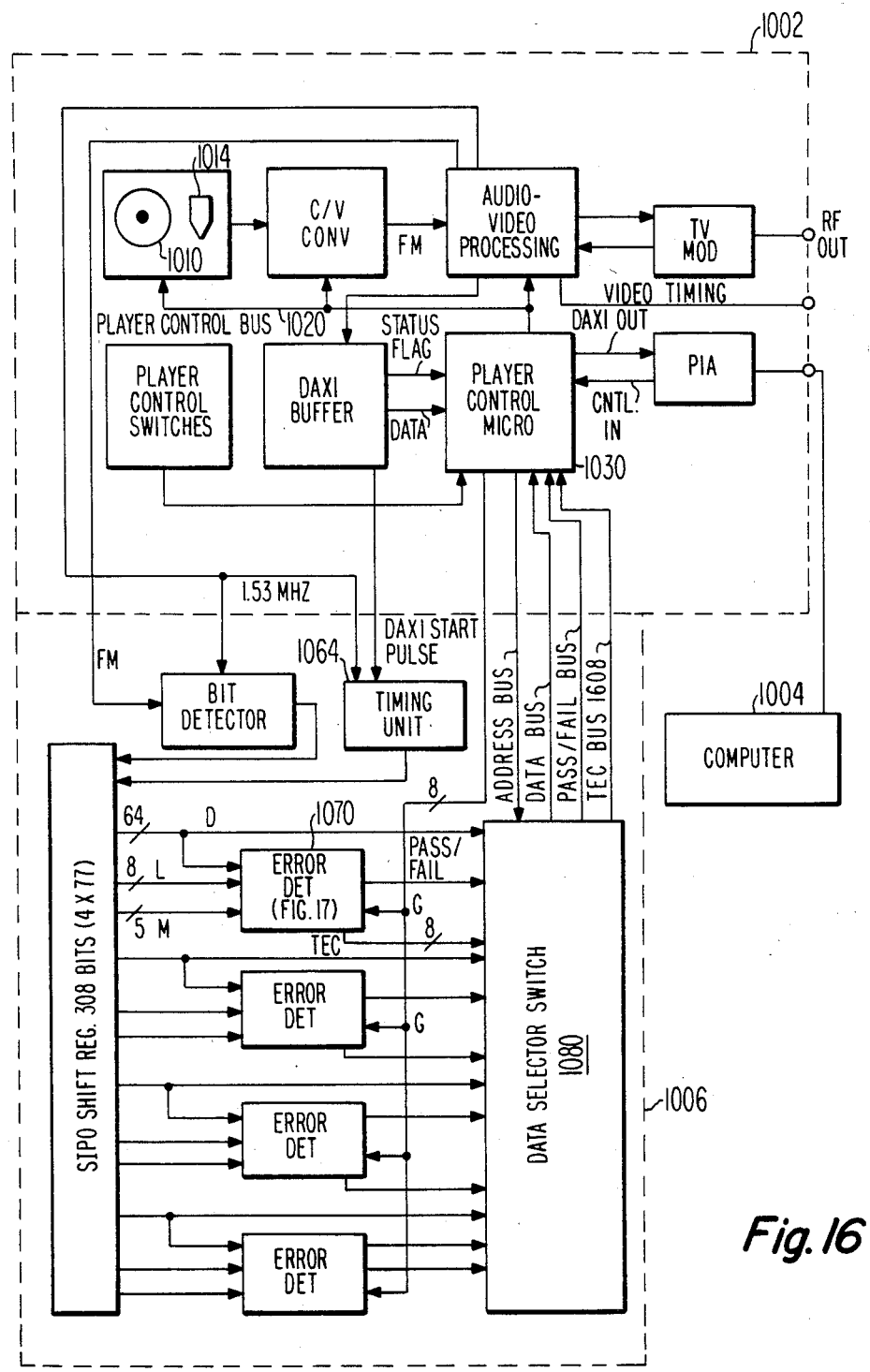
FIG. 16 is a block diagram illustrating certain modification of the system of FIG. 10.

FIG. 16 illustrates a modification of the interactive system of FIG. 10 wherein the remainder in the EDC detector is used to identify tracking errors and is applied to the player control microprocessor to correct them. This modification comprises eliminating the DAXI start code detector 1062, modifying the EDC detector (FIG. 17) and locating decoder 1006 within the player with the player microprocessor providing the convolutional code correction and, additionally, track error correction (TEC) from TEC data recovered from the decoder error detection decoder (EDC).

Figure 17:
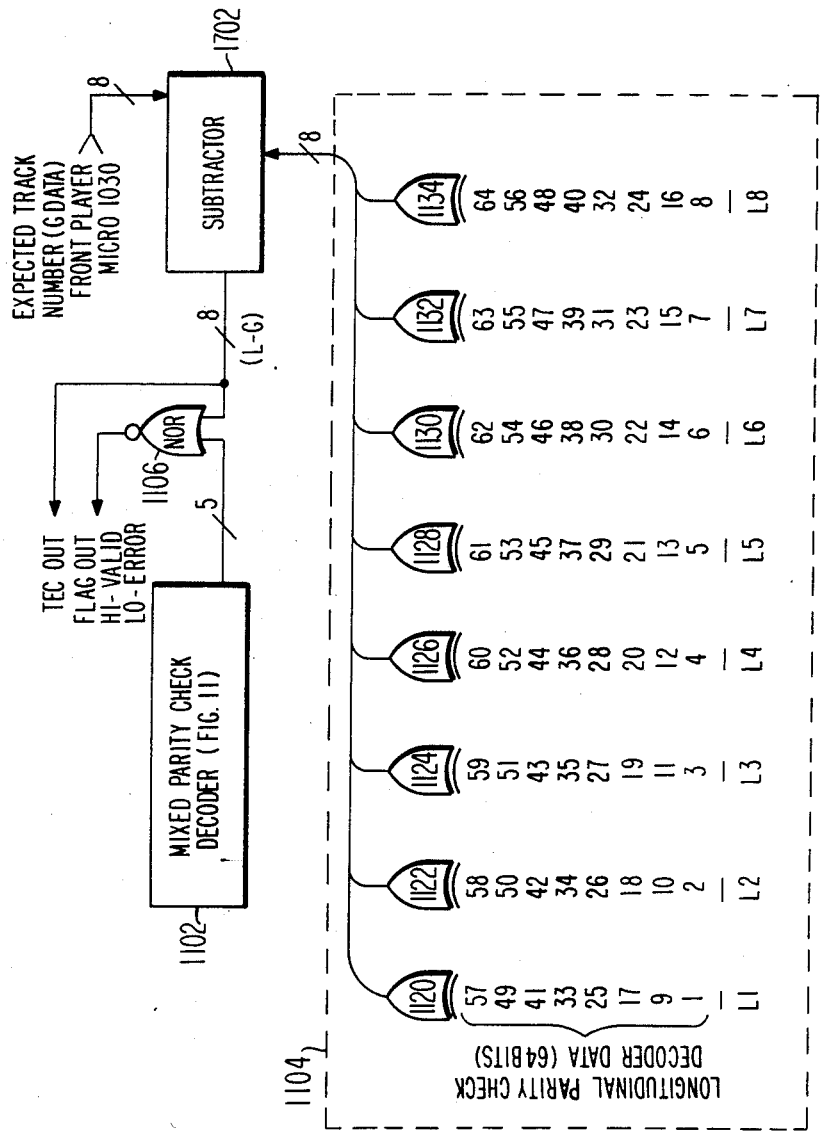
FIG. 17 is a block diagram illustrating certain modifications of the decoder of FIG. 11.

In more detail, TEC data is obtained by modifying EDC 1070 as shown in FIG. 17. No change is made to the mixed (M) parity check decoder 1102. The longitudinal (L) parity check decoder is modified only to the extent of deleting all of the "G" (expected track number) inputs to XOR gates 1120–1134. The final modification comprises adding a subtractor 1702 which subtracts the 8 "G" data bits provided (FIG. 16) by the player control micro 1030 from the 8 outputs of the L decoder and applies the resultant difference (TEC) to NOR gate 1106. The TEC output is zero if the 8 bits of the DAXI code field number (which represent the track number) equals the outputs of gates 1120–1134 indicating that the track number conveyed by the EDC is the same as that conveyed by DAXI.

A non-zero TEC provides both the sense and the magnitude of a track skip or error of up to 128 "grooves" or information tracks of the disc. This is applied via data selector switch 1080 and TEC bus 1608 to the player micro 1030 which then applied appropriate "kick" pulses (via bus 1020) to the stylus kicker coils in transducer 1014 in a sense to correct the tracking error.

The DAXI start code detector 1062 was deleted from the decoder 1006 of FIG. 16 because the decoder in this example of the invention is inside the video disc player where the start pulse (for timing unit 1064) is already available from the DAXI buffer integrated circuit 1034.

What is claimed is:

1. A method for encoding data on a video signal carrier wave to be recorded on a video disc, comprising the steps of:

modulating said video signal carrier wave with block encoded data during a selected line of the vertical interval of said video signal carrier wave; said block encoded data including a framing code and a field identification code; and modulating said video signal carrier wave with convolutionally encoded data during a subsequent line of the vertical interval of said video signal carrier wave, each line of said convolutionally encoded data including an error check code conveying information relating to a predetermined subset of said field identification code, each line of convolutionally encoded data in a given field being in a timed relationship with respect to the block encoded data of that field and having no framing code.

2. The method recited in claim 1 wherein each line, $A_N$, of said convolutionally encoded data alternates on a field-by-field basis with a corresponding line of parity data, $P_N$, each parity line being generated on a bit-by-bit basis in accordance with the equation $P_N = A_{N+1}$ EXOR $A_{N+2}$ EXOR $A_{N+7}$.

3. In a video disc recording apparatus of a type including a first means for encoding a video signal to be recorded with a digital auxiliary information code word during a selected line of the vertical interval of said video signal, said code word including a framing code and at least a field identification code, the improvement for encoding at least one second information code word on said video signal comprising:

a source for providing said second information code word;

convolutional encoder means for generating a parity word for each said second information code word;

error check encoder means for appending an error check word to each parity word and to each second information code word, each error check word including information related to a predetermined subset of said field identification code; and means for encoding said video signal with said second information code words and said parity words with their respective error check words on alternate fields of said video signal in a timed relationship with each said digital auxiliary information code word.

4. In a video disc recording apparatus of a type including means for encoding a first information word on a video signal to be recorded, said first information word including a framing code and a data code, said data code including a field identification code, the improvement for encoding a second information word on said video signal, comprising:

a source for providing a plurality of said second information words;

parity generator means for generating a parity word representative of the exclusive logical sum of predetermined ones of said second information words;

error check encoder means for appending an error check word to each parity word and to each second information word, each error check word including a predetermined number of bits related to a subset of said field identification code of each said first information word; and means for encoding said second information words and said parity words with their respective error check codes on alternate fields of said video signal, each second information word and each parity word having no framing code and being encoded a predetermined number of clock cycles subsequent to said first information word.

5. Data decoder apparatus for use with a video disc player for decoding video disc related data encoded in a format wherein a selected line of the vertical interval of the player video signal is modulated by a first data word including a framing code and at least a field number code and wherein at least a second line of the vertical interval is modulated by at least one second data word alternating on a field by field basis with a parity check word, each data word and each parity check word having an error detection portion containing a subset of said field number code and having no framing code, said apparatus comprising:

first means responsive to said first data word for providing an output signal representative of said subset of field number code; and second means responsive to said framing code and to the output of said first means for detecting said second data word and said parity check word and providing an error check output signal manifestation for each data word and each parity word.

6. Decoder apparatus as recited in claim 5 further comprising third means for convolutionally decoding said second data words in accordance with said parity check words over a number of fields of said video signal greater than the number of fields recorded on convolution of the information track of said video disc.

7. Decoder apparatus as recited in claim 6 wherein said third means comprises computer means external to said video disc player.

8. Decoder means as recited in claim 6 wherein said third means comprises computer means internal to said video disc player, said third means having output means for bi-directionally communicating with an external computer means.

9. Decoder apparatus as recited in claim 5 wherein said second means is of a type wherein said error check output signal manifestation comprises a one bit pass/fail validity flag.

10. Decoder apparatus as recited in claim 5 wherein said second means is of a type wherein said error check output signal manifestation comprises a plurality of bits representative of a track error correction control code.

11. Decoder apparatus as recited in claim 10 further comprising means for applying said plurality of bits representative of said track error correction control code to a point in said disc player for correcting tracking errors.

12. In mastering apparatus of a type for encoding data on a video signal to be recorded on a video disc and having means for modulating a line of the video signal with block encoded data having a framing code and a field number code, the improvement for encoding further data on said disc, comprising:

further means for modulating said video signal during a subsequent line of said vertical interval with convolutionally encoded data having an error check code conveying information relating to said subset of said field number code, said convolutionally encoded data being in a timed relationship with said framing code, having no internal framing code bits and spanning a number of fields greater than that contained on one convolution of the information track of said video disc.

13. Decoder apparatus for use with a video disc player of a type for playing discs having data of a first type recorded thereon including framing code bits and field number bits and data of a second type recorded thereon in convolutional form exclusive of framing code bits and inclusive of an error detection code having check bits related to a subset of said field number code, said apparatus comprising:

convolutional code decoder means for receiving said data of said second type;

detector means responsive to said framing code bits for supplying clocking signals to said decoder means for decoding said data of said second type;

error check decoder means; and means for recovering said subset of said field numbers from said data of said first type for initializing said error check decoder means to provide an error check signal manifestation for use by track error correction means in said player.

14. Decoder apparatus as recited in claim 13 wherein said error check signal manifestation comprises an eight bit control code representative of the difference between a track number conveyed by said data of said first type and a track number conveyed by said data of said second type.

15. Decoder apparatus as recited in claim 14 wherein said decoder apparatus is physically located within said video disc player and employs circuit elements common to signal processing elements for said data of said first type.

16. Decoder apparatus as recited in claim 15 wherein said convolutional decoder means includes input means adapted to receive non-comb filtered data of said second type.

17. In a video disc player for playing a video disc having a signal track recorded with a carrier modulated video signal, said video signal including a block encoded data component having framing bits and field number bits and further including a convolutionally encoded data component devoid of framing bits but including program data lines and program parity lines which alternate on a field-by-field basis, each line having an error detection code comprising a number of bits representative of a predetermined subset of said field number bits of said block encoded data component, said video disc player including a signal pickup means for sensing said recorded carrier, a system for recovering said convolutionally encoded data component, comprising:
 (a) first means coupled to said signal pickup means for detecting and storing said field number bits;
 (b) second means coupled to said signal pickup means for detecting and storing said convolutionally encoded data component; and
 (c) third means responsive to a subset of the stored field number bits of said first means and to the error detection component of said convolutionally encoded data component for providing an error indication signal manifestation.

18. A video disc player as recited in claim 17 wherein said third means comprises:

longitudinal error check decoder means including a plurality of gate means, each gate means having inputs coupled to receive respective data bits and a respective longitudinal error check bit from said second means and each having an input coupled to receive a respective bit of said predetermined subset of said field number bits of said first means, each of said plurality of gate means having a respective output;

mixed parity check decoder means including a second plurality of said gate means, each gate means having inputs coupled to receive a selected number of said data bits and a respective mixed parity check bits from said second means and each having a respective output; and output gate means having inputs coupled to respective outputs of said longitudinal error check decoder means and of said mixed parity check decoder means and having at least one output for providing said error indicating signal manifestation.

19. A video disc player as recited in claim 17 wherein said third means comprises:

longitudinal error check decoder means including a plurality of gate means, each gate means having inputs coupled to receive respective data bits and respective longitudinal error check bits from said second means, each gate means having an output;

mixed parity check decoder means including a second plurality of said gate means, each gate means having inputs coupled to receive a selected number of said data bits and a respective mixed parity check bit from said second means, each gate means having an output;

subtraction means having inputs coupled to said first means and coupled to the outputs of said longitidinal parity check decoder means and having output for providing a difference output signal; and output gate means responsive to said difference output signal and to the outputs of said mixed parity check decoder means for providing a single bit output signal indicative of validity of said convolutionally encoded data component, said difference output signal of said subtraction means providing a measure of the magnitude of a tracking error of said signal pickup means.

* * * * *